(12) United States Patent
Lim et al.

(10) Patent No.: US 7,465,634 B2
(45) Date of Patent: Dec. 16, 2008

(54) METHOD OF FORMING INTEGRATED CIRCUIT DEVICES HAVING N-MOSFET AND P-MOSFET TRANSISTORS WITH ELEVATED AND SILICIDED SOURCE/DRAIN STRUCTURES

(75) Inventors: Peng-Soon Lim, Hsinchu (TW); Yong-Tian Hou, Singapore (SG); Jin Ying, Singapore (SG); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/583,500

(22) Filed: Oct. 18, 2006

(65) Prior Publication Data

US 2008/0096336 A1 Apr. 24, 2008

(51) Int. Cl.
*H01L 21/336* (2006.01)

(52) U.S. Cl. .................. 438/300; 438/303; 438/649; 438/682; 257/E21.17; 257/E21.324; 257/E21.421; 257/E21.435; 257/E21.438

(58) Field of Classification Search ............ 438/270, 438/291, 300, 303, 274, 649, 663, 680, 682
See application file for complete search history.

(56) References Cited

U.S. PATENT DOCUMENTS 6,413,829 B1* 7/2002 Yu ............................ 438/311

6,878,592 B1* 4/2005 Besser et al. ............... 438/285
7,175,709 B2* 2/2007 Tsai et al. ..................... 117/86
7,355,214 B2* 4/2008 Noguchi et al. ............. 257/190

OTHER PUBLICATIONS

Ang, K. H., et al., "Enhanced Performance in 50nm N-MOSFETs with Silicon-Carbon Source/Drain Regions," 2004 IEEE, IEDM, pp. 1069-1071.

* cited by examiner

*Primary Examiner*—David Nhu
(74) *Attorney, Agent, or Firm*—Slater & Matsil, L.L.P.

(57) ABSTRACT

An n-FET and a p-FET each have elevated source/drain structures. Optionally, the p-FET elevated-SOURCE/DRAIN structure is epitaxially grown from a p-FET recess formed in the substrate. Optionally, the n-FET elevated-SOURCE/DRAIN structure is epitaxially grown from an n-FET recess formed in the substrate. The n-FET and p-FET elevated-source/drain structures are both silicided, even though the structures may have different materials and/or different structure heights. At least a thermal treatment portion of the source/drain structure siliciding is performed simultaneously for the n-FET and p-FET elevated source/drain structures. Also, the p-FET gate electrode, the n-FET gate electrode, or both, may optionally be silicided simultaneously (same metal and/or same thermal treatment step) with the n-FET and p-FET elevated-source/drain structures, respectively; even though the gate electrodes may have different materials, different silicide metal, and/or different electrode heights. The silicides formed on n-FET and p-FET elevated-source/drain structures preferably do not extend below a top surface of the substrate more than about 250 angstroms; and the structure heights may be selected to provide this.

20 Claims, 17 Drawing Sheets

METHOD OF FORMING INTEGRATED CIRCUIT DEVICES HAVING N-MOSFET AND P-MOSFET TRANSISTORS WITH ELEVATED AND SILICIDED SOURCE/DRAIN STRUCTURES

TECHNICAL FIELD

The present invention generally relates to the fabrication of semiconductor devices in integrated circuit chips. In one aspect it relates more particularly to an integrated circuit device having n-MOSFET and p-MOSFET transistors with elevated and silicided source/drain structures and methods of making the same.

BACKGROUND

As technology progresses and higher switching speeds are sought, the physical size of semiconductor devices continues to decrease. For some time metal gates were the norm for metal-oxide-semiconductor (MOS) devices. Early MOS devices often had metal gate electrodes made from aluminum or alloys of aluminum. Aluminum was preferred for its ease of deposition and etching, its favorable adhesion to SiO2 and Si surfaces, and its lack of corrosion issues. However, aluminum had some downsides, such as electro-migration and spiking into shallow junctions. The downsides were often overcome by alloying aluminum with copper or silicon. However, as multiple levels of metal interconnects at the back-end-of-the-line, aluminum and aluminum alloys were not able to withstand the high thermal budgets needed for deposition and annealing of intermetal dielectrics due to aluminum's low melting and alloying temperatures.

In the early 1970's, doped polysilicon gate electrodes began to be used. This also led to complementary-MOS (CMOS) technology that provided the ability to tailor the work function of the gate electrode for negative-channel MOS (NMOS) and positive-channel MOS (PMOS) devices. The work function of the gate electrode did not require a lot of attention in the design because the threshold voltage for the device depended more upon other factors, such as substrate doping, gate oxide charge, and gate oxide thickness. And because operating voltages were high relative to today's standards for high-speed logic devices, the gate electrode was not as critical in the control of the threshold voltage setting.

Scaling down the physical size of semiconductor devices continued due to technical and economic factors. For example, the output or drive current of a device available to switch its load devices increases linearly as its physical channel length decreases. Also, the current required by load devices to achieve switching decreases as their gate area and physical channel length decreases. Because the drive current requirement to switch the load devices depends, at least in part, on the total load capacitance and area, there is also a strong motivation to reduce the size of the complete device, not only its physical channel length. And economically, it is desirable to increase the number of devices yielded from each wafer, which further drives the device dimensions smaller. But as device dimensions decrease, new technical issues arise.

Doped polysilicon gate electrodes are now being found to be inadequate compared to metal silicided gates. Transistor physical gate length (or channel length) is reaching a point where doping levels in polysilicon can no longer be increased sufficiently to support the electrical potential profiles desired. In CMOS devices where the polysilicon gate electrode is doped with an opposite conductivity type than the channel in the substrate, there is a tendency for the gate electrode to deplete and invert when the device is biased into substrate inversion for operation. Any depletion of the polysilicon surface at the gate dielectric acts as an additional dielectric region, which increases the equivalent oxide thickness (EOT) of the gate dielectric. A push to increase boron concentrations in the polysilicon gate dielectric to minimize depletion, together with the trend of thinning the gate dielectric, has lead to increased boron diffusion through the gate dielectric and into the channel of the PMOS device. This alters the threshold voltage in an uncontrollable and undesirable way.

As a result of the recent issues with traditional doped polysilicon gate electrodes discussed above (at least in part), there has been a return to the use of metal gate electrodes in the form of metal silicided gate electrodes, especially in dual-work function gate electrodes. Fully silicided (FUSI) gate electrodes are often preferred based on process/tool compatibility and because it offers advantages over metal gate electrodes. However, there are already many well established processes in place for making semiconductor devices with doped polysilicon gate electrodes. Thus, it is often preferred to use processes that integrate the formation a FUSI gate electrode with minimal changes to current or past process flows used to make devices with a doped polysilicon gate electrode.

During the formation of a FUSI gate electrode, often the source/drain regions are also silicided, and preferably during the same process of forming the FUSI gate electrode (i.e., one silicidation process for both the gate electrode and the source/drain regions). However, this often leads to deep silicidation in the source/drain regions below the surface of the substrate. This is typically undesirable because it creates a current crowding effect at the channel region. Hence, a need exists for a way to form silicided gate electrodes while forming silicided source/drain regions, but without creating a structure susceptible to current crowding effects. It would be further desirable to be able to silicide the gate electrode while siliciding the source/drain regions in a single silicidation step.

SUMMARY OF THE INVENTION

The problems and needs outlined above may be addressed by embodiments of the present invention. In accordance with one aspect of the present invention, an n-FET and a p-FET each have elevated source/drain structures. An n-FET and a p-FET each have elevated source/drain structures. Optionally, the p-FET elevated-source/drain structure is epitaxially grown from a p-FET recess formed in the substrate. Optionally, the n-FET elevated-SOURCE/DRAIN structure is epitaxially grown from an n-FET recess formed in the substrate. The n-FET and p-FET elevated-source/drain structures are both silicided, even though the structures may have different materials and/or different structure heights. At least a thermal treatment portion of the source/drain structure siliciding is performed simultaneously for the n-FET and p-FET elevated source/drain structures. For example, the elevated n-FET source/drain structure may be silicided simultaneously with the n-FET gate electrode (using the same metal for n-FETs) and the p-FET source/drain structure may be silicided simultaneously with the p-FET gate electrode (using the same metal for p-FETs). Also, the p-FET gate electrode, the n-FET gate electrode, or both, may optionally be silicided simultaneously (same metal and/or same thermal treatment step) with the n-FET and p-FET elevated-source/drain structures, respectively; even though the gate electrodes may have different materials, different silicide metal, and/or different electrode heights. The silicides formed on n-FET and p-FET elevated-source/drain structures preferably do not extend below a top surface of the substrate more than about 250 angstroms; and the structure heights may be selected to provide this.

In accordance with another aspect of the present invention, a method of forming an integrated circuit device is provided. This method includes the following steps described in this paragraph. The order of the steps may vary, may be sequential, may overlap, may be in parallel, and combinations thereof, if not otherwise stated. An n-FET gate dielectric is formed on a substrate. A p-FET gate dielectric is formed on the substrate. Preferably, the n-FET gate dielectric and the p-FET gate dielectric each include high-k dielectric material. An n-FET gate electrode is formed on the n-FET gate dielectric. A p-FET gate electrode is formed on the p-FET gate dielectric. The n-FET gate electrode and the p-FET gate electrode each include metal. The n-FET gate dielectric is located between the n-FET gate electrode and the substrate at an n-FET channel region. The p-FET gate dielectric is located between the p-FET gate electrode and the substrate at a p-FET channel region. An n-FET spacer structure is formed adjacent to the n-FET gate electrode. A p-FET spacer structure is formed adjacent to the p-FET gate electrode. An elevated n-FET source/drain structure is formed adjacent to the n-FET gate electrode, such that the n-FET spacer structure is located at least partially between the elevated n-FET source/drain structure and the n-FET gate electrode. Optionally, a p-FET recess is formed in the substrate adjacent to the p-FET spacer structure. An elevated p-FET source/drain structure is formed and extends from the substrate in the p-FET recess (in the case where a recess is used), such that the p-FET spacer structure is located at least partially between the elevated p-FET source/drain structure and the p-FET gate electrode. At least a first portion of the elevated n-FET source/drain structure and at least a first portion of the elevated p-FET source/drain structure are simultaneously silicided in a source/drain-structure silicidation step.

This paragraph describes some embodiments of the aspect of the present invention described in the immediately preceding paragraph. The source/drain-structure silicidation step may further include forming a protective mask, depositing a metal layer over the n-FET and p-FET source/drain structures, and applying a thermal treatment. The n-FET gate electrode may be also silicided during the source/drain-structure silicidation step. The n-FET gate electrode may be silicided in a gate-electrode silicidation step, wherein the source/drain-structure silicidation step is different from the gate-electrode silicidation step. The p-FET gate electrode may be also silicided during the source/drain-structure silicidation step. The p-FET gate electrode may be silicided in a gate-electrode silicidation step, wherein the source/drain-structure silicidation step is different from the gate-electrode silicidation step. The p-FET metal gate electrode may be silicided in a p-FET gate-electrode silicidation step and the n-FET gate electrode may be silicided in an n-FET gate-electrode silicidation step, wherein the source/drain-structure silicidation step is different from the p-FET gate-electrode silicidation step, the source/drain-structure silicidation step is different from the n-FET gate-electrode silicidation step, and the p-FET gate-electrode silicidation step is different from the n-FET gate-electrode silicidation step. The p-FET gate electrode and the n-FET gate electrode may be simultaneously silicided in a gate-electrode silicidation step, wherein the source/drain-structure silicidation step is different from the gate-electrode silicidation step. The method may further include forming an n-FET recess in the substrate adjacent to the n-FET spacer structure, wherein the elevated n-FET source/drain structure extends from the substrate in the n-FET recess. The method may further include selecting an n-FET source/drain structure height to control a depth of the silicidation of the n-FET source/drain structure so that the silicidation depth is not more than about 250 angstroms below a top surface of the substrate. The method may further include forming an n-FET recess in the substrate adjacent to the n-FET spacer structure and epitaxially growing the elevated n-FET source/drain structure from the substrate in the n-FET recess, wherein the epitaxial growing is performed using a selective epitaxial growth process. The elevated n-FET source/drain structure may be or may include Si:C, having about 1-2% carbon. The forming of the elevated p-FET source/drain structure may be by epitaxially growing the elevated p-FET source/drain structure from the substrate in the p-FET recess, wherein the epitaxial growing is performed using a selective epitaxial growth process. The elevated p-FET source/drain structure may be or may include SiGe. The n-FET gate dielectric and the p-FET gate dielectric each may include a same high-k dielectric material layer.

In accordance with yet another aspect of the present invention, a method of forming an integrated circuit device is provided. This method includes the following steps described in this paragraph. The order of the steps may vary, may be sequential, may overlap, may be in parallel, and combinations thereof, if not otherwise stated. An n-FET gate dielectric is formed on a substrate. A p-FET gate dielectric is formed on the substrate. The n-FET gate dielectric and the p-FET gate dielectric each include high-k dielectric material. An n-FET gate electrode is formed on the n-FET gate dielectric. A p-FET gate electrode is formed on the p-FET gate dielectric. The n-FET gate electrode and the p-FET gate electrode each include metal. The n-FET gate dielectric is located between the n-FET gate electrode and the substrate at an n-FET channel region. The p-FET gate dielectric is located between the p-FET gate electrode and the substrate at a p-FET channel region. An n-FET spacer structure is formed adjacent to the n-FET gate electrode. An n-FET recess is formed in the substrate adjacent to the n-FET spacer structure. An elevated n-FET source/drain structure is epitaxially grown from the substrate in the n-FET recess, wherein the epitaxial growing is performed using a first selective epitaxial growth process, such that the n-FET spacer structure is located at least partially between the elevated n-FET source/drain structure and the n-FET gate electrode. A p-FET spacer structure is formed adjacent to the p-FET gate electrode. A p-FET recess is formed in the substrate adjacent to the p-FET spacer structure. An elevated n-FET source/drain structure is epitaxially grown from the substrate in the n-FET recess, wherein the epitaxial growing is performed using a first selective epitaxial growth process, such that the n-FET spacer structure is located at least partially between the elevated n-FET source/drain structure and the n-FET gate electrode. The elevated n-FET source/drain structure and the elevated p-FET source/drain structure are simultaneously silicided.

In accordance with still another aspect of the present invention, a method of forming an integrated circuit device is provided. This method includes the following steps described in this paragraph. The order of the steps may vary, may be sequential, may overlap, may be in parallel, and combinations thereof, if not otherwise stated. An n-FET gate dielectric is formed on a substrate. A p-FET gate dielectric is formed on the substrate. The n-FET gate dielectric and the p-FET gate dielectric each include high-k dielectric material. An n-FET gate electrode is formed on the n-FET gate dielectric. A p-FET gate electrode is formed on the p-FET gate dielectric. The n-FET gate electrode and the p-FET gate electrode each include metal. The n-FET gate dielectric is located between the n-FET gate electrode and the substrate at an n-FET channel region. The p-FET gate dielectric is located between the p-FET gate electrode and the substrate at a p-FET channel region. An n-FET spacer structure is formed adjacent to the n-FET gate electrode. An n-FET recess is formed in the substrate adjacent to the n-FET spacer structure. An elevated n-FET source/drain structure is formed adjacent to the n-FET gate electrode, such that the n-FET spacer structure is located at least partially between the elevated n-FET source/drain structure and the n-FET gate electrode. A p-FET recess is formed in the substrate adjacent to the p-FET spacer structure. An elevated p-FET source/drain structure is formed and extends from the substrate in the p-FET recess, such that the p-FET spacer structure is located at least partially between the elevated p-FET source/drain structure and the p-FET gate electrode. The elevated n-FET source/drain structure and the elevated p-FET source/drain structure are simultaneously silicided. Also, the p-FET gate electrode structure, n-FET gate electrode structure, or both, are simultaneously silicided while siliciding the elevated n-FET source/drain structure and the elevated p-FET source/drain structure. An n-FET source/drain structure height is selected to control a silicidation depth of the n-FET source/drain structure so that the silicidation depth of the n-FET source/drain structure is not more than about 250 angstroms below a top surface of the substrate. A p-FET source/drain structure height is selected to control a silicidation depth of the p-FET source/drain structure so that the silicidation depth of the p-FET source/drain structure is not more than about 250 angstroms below the top surface of the substrate. Optionally, the elevated n-FET source/drain structure may be epitaxially grown from the substrate in an n-FET recess, wherein the epitaxial growing is performed using a first selective epitaxial growth process.

In accordance with another aspect of the present invention, an integrated circuit device comprising an n-FET transistor is provided. The n-FET transistor includes an n-FET substrate. The n-FET substrate includes an n-FET channel region of the n-FET transistor. The n-FET transistor further includes an n-FET gate electrode formed over the n-FET substrate and extends over the n-FET channel region. At least at the n-FET channel region, at least a majority of the n-FET gate electrode includes metal. The n-FET still further includes an n-FET gate dielectric located between the n-FET gate electrode and the n-FET substrate at the n-FET channel region. The n-FET gate dielectric includes a first high-k dielectric material. The n-FET yet further includes elevated n-FET source/drain structures located adjacent to the n-FET gate electrode. The elevated n-FET source/drain structures include a first portion of the elevated n-FET source/drain regions extending above the n-FET substrate adjacent to the n-FET gate electrode. At least part of the first portion of the elevated n-FET source/drain structures are silicided.

This paragraph describes some embodiments of the aspect of the present invention described in the immediately preceding paragraph. The elevated n-FET source/drain structures may be formed on the n-FET substrate. The elevated n-FET source/drain structures may include a second portion of the elevated n-FET source/drain structures extending into n-FET recesses of the n-FET substrate. The elevated n-FET source/drain structures may be epitaxially grown from the n-FET substrate in the n-FET recesses. At least part of the second portion of the elevated n-FET source/drain structures may be silicided to an n-FET silicided depth below a top surface of the n-FET substrate. The n-FET silicided depth is preferably not more than about 250 angstroms below a top surface of the substrate. Hence, the silicidation formed can either be (a) confined within the first portion of elevated n-FET source/drain structure, or (b) extended into the second portion, but the depth is preferably not more than about 250 angstroms beneath the substrate. The elevated n-FET source/drain structures may be epitaxially grown from the n-FET substrate. The elevated n-FET source/drain structures may include a source/drain structure material. The source/drain structure material may be silicon, germanium, carbon, and combinations thereof. The integrated circuit device may further include a p-FET transistor. The p-FET transistor may include a p-FET substrate. The p-FET substrate may include a p-FET channel region of the p-FET transistor. The p-FET transistor may further include a p-FET gate electrode formed over the p-FET substrate and extending over the p-FET channel region. At least at the p-FET channel region, at least a majority of the p-FET gate electrode may include metal. The p-FET transistor may yet further include a p-FET gate dielectric located between the p-FET gate electrode and the p-FET substrate at the p-FET channel region. The p-FET gate dielectric may include a second high-k dielectric material. The p-FET transistor may still further include elevated p-FET source/drain structures located adjacent to the p-FET gate electrode. The elevated p-FET source/drain structures may include a first portion of the elevated p-FET source/drain structures extending above the p-FET substrate adjacent to the p-FET gate electrode. At least part of the first portion of the elevated p-FET source/drain structures may be silicided. The elevated p-FET source/drain structures may include a second portion of the elevated p-FET source/drain structures extending into p-FET recesses of the p-FET substrate. At least part of the second portion of the elevated p-FET source/drain structures may be silicided to a p-FET silicided depth below a top surface of the p-FET substrate. The p-FET silicided depth is preferably not more than about 250 angstroms below a top surface of the substrate. Hence, the silicidation formed can either be (a) confined within the first portion of elevated p-FET source/drain structure, or (b) extended into the second portion, but the depth is preferably not more than about 250 angstroms beneath the substrate. The second high-k dielectric material may be the same as the first high-k dielectric material. A spacer structure may be located between the elevated n-FET source/drain structures and the n-FET gate electrode. The n-FET gate electrode may include an n-FET gate electrode material. The n-FET gate electrode materials may include metal silicide, metal carbide, carbon, metal nitride, metal silicon nitride, and combinations thereof. The metal of the n-FET gate electrode may include a metal material. The gate electrode metal material may include tantalum, titanium, ruthenium, molybdenum, nickel, cobalt, platinum, aluminum, ytterbium, alloys thereof, and combinations thereof. The first high-k dielectric material may include a gate dielectric material such as a single-metal oxide, a multi-metal oxide, silicate, hafnium, aluminum, tantalum, titanium, zirconium, oxygen, nitrogen, silicon, zinc, and combinations thereof. The n-FET channel region may be strained, at least in part, by the elevated n-FET source/drain structures.

In accordance with another aspect of the present invention, an integrated circuit device is provided. The integrated circuit device includes an n-FET transistor. The n-FET transistor includes an n-FET substrate including an n-FET channel region of the n-FET transistor. The n-FET transistor further includes an n-FET gate electrode formed over the n-FET substrate and extending over the n-FET channel region. At least at the n-FET channel region, at least a majority of the n-FET gate electrode includes metal. The n-FET transistor still further includes an n-FET gate dielectric located between the n-FET gate electrode and the n-FET substrate at the n-FET channel region. The n-FET gate dielectric includes a first high-k dielectric material. The n-FET transistor yet further includes elevated n-FET source/drain structures located adjacent to the n-FET gate electrode. The elevated n-FET source/drain structures includes a first portion of the elevated n-FET source/drain regions extended above the n-FET substrate adjacent to the n-FET gate electrode. At least part of the first portion of the elevated n-FET source/drain structures is silicided. The integrated circuit device further includes a p-FET transistor. The p-FET transistor includes a p-FET substrate including a p-FET channel region of the p-FET transistor. The p-FET transistor further includes a p-FET gate electrode formed over the p-FET substrate and extending over the p-FET channel region. At least at the p-FET channel region, at least a majority of the p-FET gate electrode includes metal. The p-FET transistor still further includes a p-FET gate dielectric located between the p-FET gate electrode and the p-FET substrate at the p-FET channel region. The p-FET gate dielectric includes a second high-k dielectric material. The p-FET transistor yet further includes elevated p-FET source/drain structures located adjacent to the p-FET gate electrode. The elevated p-FET source/drain structures include a first portion of the elevated p-FET source/drain structures extended above the p-FET substrate adjacent to the p-FET gate electrode. At least part of the first portion of the elevated p-FET source/drain structures is silicided. A second portion of the elevated p-FET source/drain structures extending into p-FET recesses of the p-FET substrate.

This paragraph describes some embodiments of the aspect of the present invention described in the immediately preceding paragraph. The elevated n-FET source/drain structures may be formed on the n-FET substrate. The elevated n-FET source/drain structures may include a second portion of the elevated n-FET source/drain structures extended into n-FET recesses of the n-FET substrate. At least part of the second portion of the elevated n-FET source/drain structures may be silicided to an n-FET silicided depth below a top surface of the n-FET substrate. The n-FET silicided depth is preferably not more than about 250 angstroms below a top surface of the substrate. At least part of the second portion of the elevated p-FET source/drain structures may be silicided to a p-FET silicided depth below a top surface of the p-FET substrate. The p-FET silicided depth is preferably not more than about 250 angstroms below a top surface of the substrate. A spacer may be located between the elevated n-FET F source/drain regions and the n-FET gate electrode. The second high-k dielectric material may be the same as the first high-k dielectric material. The elevated n-FET source/drain structures may be epitaxially grown from the n-FET substrate. The elevated p-FET source/drain structures may be epitaxially grown from the p-FET substrate in the p-FET recesses. At least part of the second portion of the elevated p-FET source/drain structures may be silicided to a p-FET silicided depth below a top surface of the p-FET substrate. The p-FET silicided depth is preferably not more than about 250 angstroms below a top surface of the substrate. A spacer may be located between the elevated n-FET source/drain regions and the n-FET gate electrode.

In accordance with yet another aspect of the present invention, a method of forming an integrated circuit device is provided. This method includes the following steps described in this paragraph. The order of the steps may vary, may be sequential, may overlap, may be in parallel, and combinations thereof, if not otherwise stated. An n-FET gate dielectric is formed on an n-FET substrate. The n-FET gate dielectric includes a first high-k dielectric material. An n-FET gate electrode is formed on the n-FET gate dielectric such that the n-FET gate dielectric is located between the n-FET gate electrode and the n-FET substrate at an n-FET channel region. At least a majority of the n-FET gate electrode includes metal at the n-FET channel region. An n-FET spacer structure is formed adjacent to the n-FET gate electrode. An elevated n-FET source/drain structure is formed adjacent to the n-FET gate electrode, such that the n-FET spacer structure is located at least partially between the elevated n-FET source/drain structure and the n-FET gate electrode. The n-FET gate electrode and at least a first portion of the elevated n-FET source/drain structure is silicided.

This paragraph describes some embodiments of the aspect of the present invention described in the immediately preceding paragraph. The siliciding of the n-FET gate electrode and the siliciding of the elevated n-FET source/drain structures may be performed simultaneously during a same silicidation process. An n-FET source/drain structure height may be selected to control a depth of the silicidation for the n-FET source/drain structure (e.g., control to not more than about 250 angstroms below a top surface of the substrate). The n-FET gate electrode may be fully silicided during the siliciding of the n-FET gate electrode. One or more n-FET recesses in the n-FET substrate may be formed adjacent to the n-FET spacer structure. The elevated n-FET source/drain structures may be epitaxially grown from the n-FET substrate in the n-FET recesses. The epitaxial growing may be performed using a selective epitaxial growth process. The elevated n-FET source/drain structures may include a source/drain structure material. A source/drain structure material included in the n-FET source/drain structure may be silicon germanium, silicon carbon, germanium, carbon, and combinations thereof, such that the n-FET channel region of the n-FET substrate may be strained. A p-FET gate dielectric on a p-FET substrate may be formed, wherein the p-FET gate dielectric includes a second high-k dielectric material. A p-FET gate electrode on the p-FET gate dielectric may be formed, such that the p-FET gate dielectric may be located between the p-FET gate electrode and the p-FET substrate at a p-FET channel region. At least a majority of the p-FET gate electrode may include metal at the p-FET channel region. A p-FET spacer structure may be formed adjacent to the p-FET gate electrode. Elevated p-FET source/drain structures may be formed adjacent to the p-FET gate electrode, such that the p-FET spacer structure may be located at least partially between the elevated p-FET source/drain structures and the p-FET gate electrode. The p-FET gate electrode may be silicided. At least a first portion of the elevated p-FET source/drain structures may be silicided.

In accordance with still yet another aspect of the present invention, a method of forming an integrated circuit device is provided. An n-FET gate dielectric is formed on an n-FET substrate and a p-FET gate dielectric is formed on a p-FET substrate. The n-FET gate dielectric and the p-FET gate dielectric each comprise a high-k dielectric material. An n-FET gate electrode is formed on the n-FET gate dielectric and a p-FET gate electrode is formed on the p-FET gate dielectric. The n-FET gate dielectric is located between the n-FET gate electrode and the n-FET substrate at an n-FET channel region. The p-FET gate dielectric is located between the p-FET gate electrode and the p-FET substrate at a p-FET channel region. An n-FET spacer structure is formed adjacent to the n-FET gate electrode and a p-FET spacer structure adjacent the p-FET gate electrode. An elevated n-FET source/drain structure is formed adjacent to the n-FET gate electrode, such that the n-FET spacer structure is located at least partially between the elevated n-FET source/drain structures and the n-FET gate electrode. An elevated p-FET source/drain structure is formed adjacent to the p-FET gate electrode, such that the p-FET spacer structure is located at least partially between the elevated p-FET source/drain structure and the p-FET gate electrode. At least a first portion of the elevated n-FET source/drain structure and a first portion of the elevated p-FET source/drain structure are silicided in a first silicidation step.

This paragraph describes some embodiments of the aspect of the present invention described in the immediately preceding paragraph. The first silicidation step may further include forming a protective mask, depositing a metal layer, and applying a thermal treatment to the n-FET and the p-FET. The n-FET gate electrode may be silicided in the first silicidation step. The n-FET gate electrode may be silicided in a second silicidation step. The p-FET gate electrode may be silicided in the first silicidation step. The p-FET gate electrode may be silicided in a second silicidation step. The p-FET gate electrode may be silicided in a second silicidation step and the n-FET gate electrode may be silicided in a third silicidation step. An n-FET recess may be formed in the n-FET substrate. The elevated n-FET source/drain structure may extend from the n-FET substrate in the n-FET recess.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
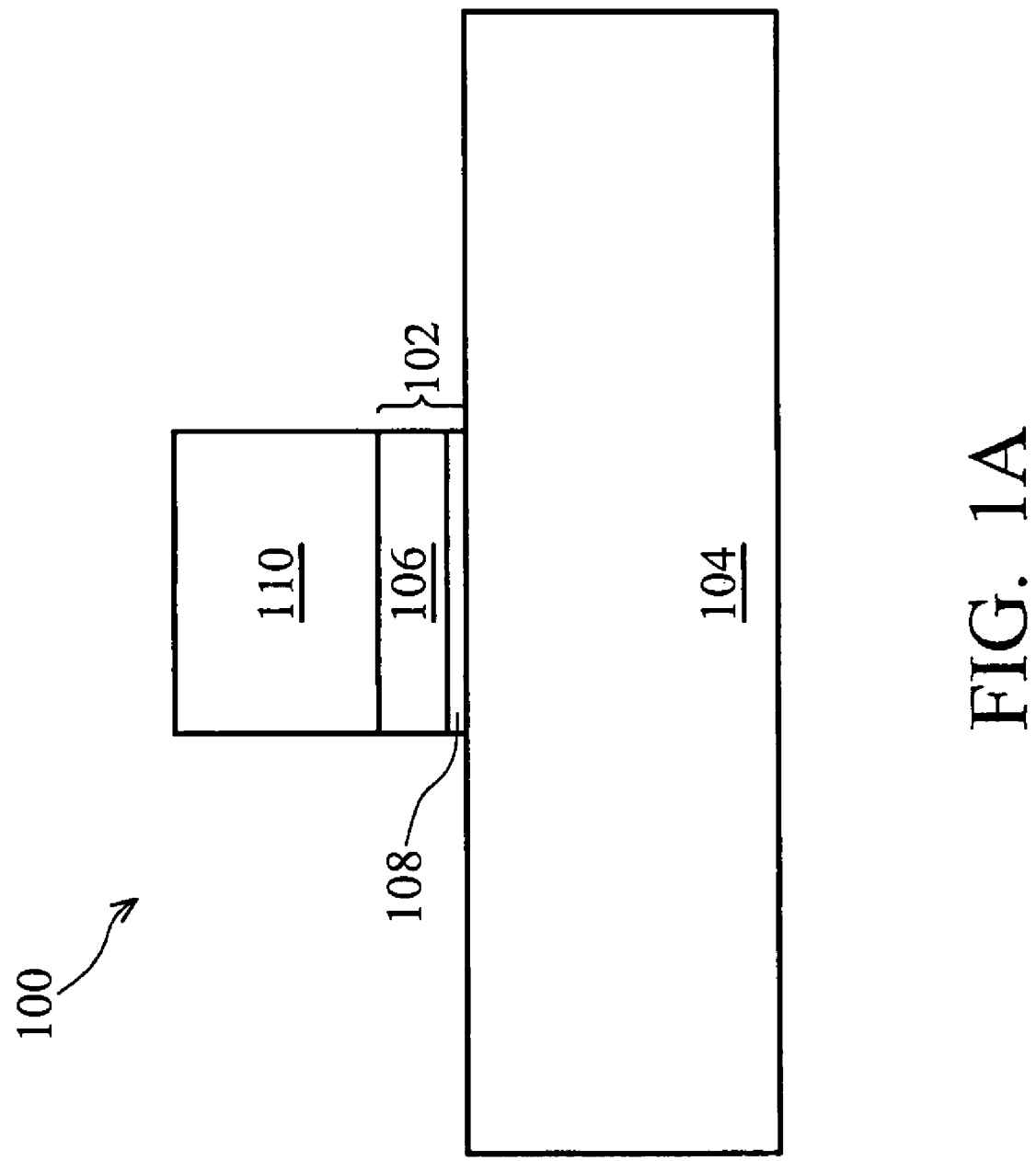
FIGS. 1A-1G show cross-sectional views of an integrated circuit device at various stages in a method of a first illustrative embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a structure of and a method of forming an N-type field effect transistor (n-FET) having elevated source/drain structures. FIGS. 1A-1G are cross-sectional views of an n-FET 100 at various stages in the method of a first illustrative embodiment.

With reference to FIG. 1A, the method of the first embodiment includes forming an n-FET gate dielectric 102 and an n-FET gate electrode 110 on an n-FET substrate 104. In FIG. 1A, the substrate 104 is P-type, however in other embodiments of the present invention, the substrate may be N-type. A substrate of an embodiment of the present invention may include N-type and P-type wells, and stacked wells (e.g., a triple well), for example. Furthermore, the substrate in embodiments of the present invention may have any suitable materials and structures currently known (e.g., SOI, deep N-well, deep P-well, buried insulator, strained channel, SiGe, etc.) or later developed. Also, isolation regions may be formed using any known or later developed process, may have any suitable shape, and may be any suitable type (e.g., shallow trench isolation, FOX, thermally grown, deep trench isolation), as needed or desired. The gate dielectric 102 in embodiments may be formed by atmospheric layer deposition (ALD), chemical vapor deposition (CVD), and plasma vapor deposition (PVD), for example.

Figure 1B:
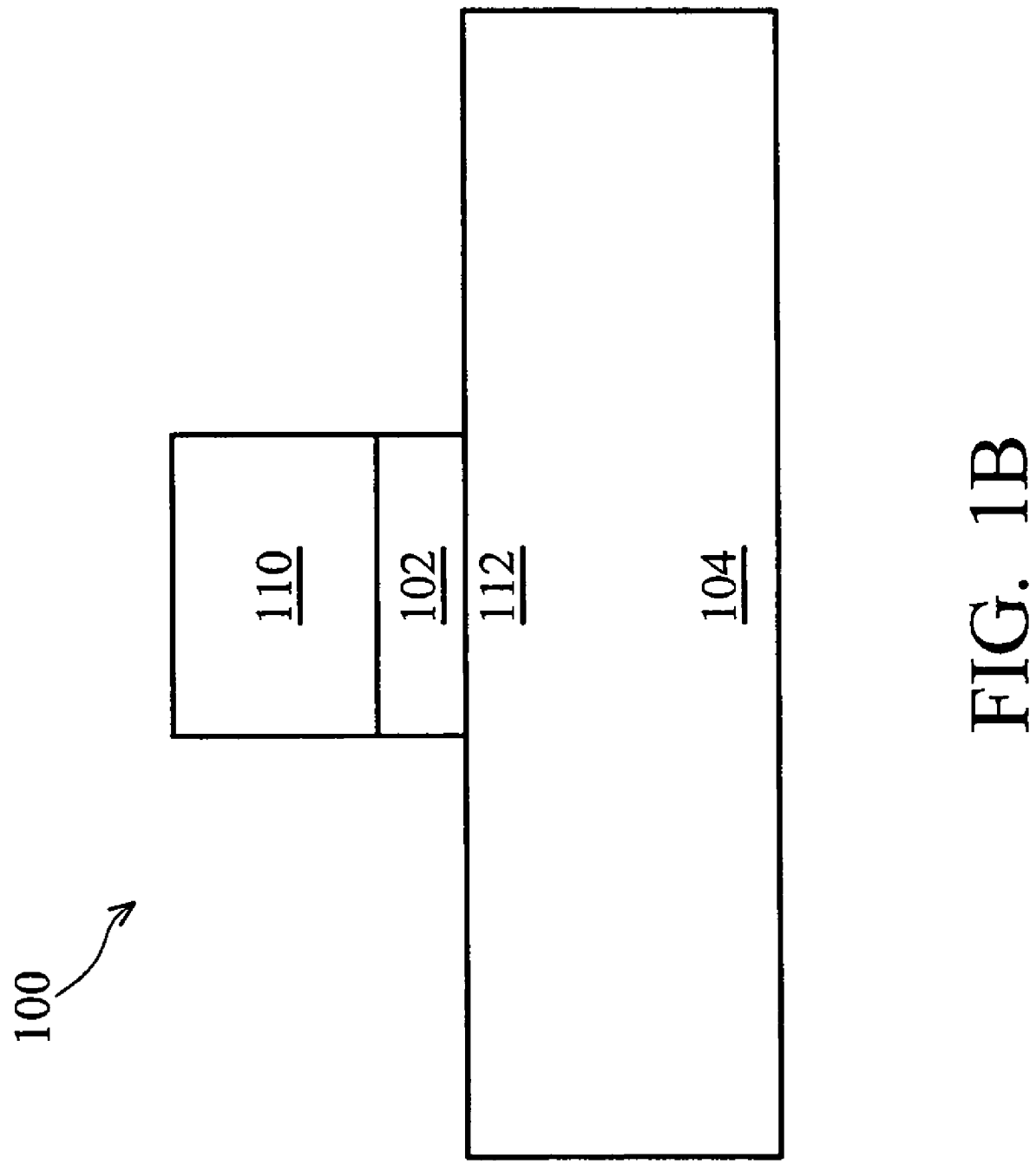

The n-FET gate dielectric 102 shown in FIG. 1A includes a high-k dielectric layer 106 formed over a base oxide layer 108. However, the n-FET gate dielectric 102 in an embodiment may be made from any suitable material(s), may be formed using any known or later developed process, and may be a single layer, a stacked dielectric structure, a composite structure, silicates on an interfacial layer, or combinations thereof, for example. The high-k material in the high-k dielectric layer 106 in an embodiment may include a single-metal oxide, multi-metal oxide, or silicates on an interfacial layer, for example. Materials in the high-k dielectric material may include hafnium, aluminum, zirconium, tantalum, titanium, alloys thereof, and combinations thereof, for example. Materials in the interfacial layer may include oxygen, nitrogen, silicon, hafnium, aluminum, zinc, tantalum, and titanium, for example. Furthermore, the physical thickness and the equivalent oxide thickness (EOT) of the gate dielectric layer 102 may be any known or later developed thickness. In FIG. 1B, the n-FET gate dielectric 102 is shown more simplified.

Referring still to FIGS. 1A and 1B, the n-FET gate electrode 110 is formed such that the n-FET gate dielectric 102 is located between the n-FET gate electrode 110 and an n-FET channel region 112 in the n-FET substrate 104. The n-FET gate electrode 110 preferably includes a lightly doped polysilicon material. In other embodiments of the present invention, the gate electrode may include metal, metal carbon, metal carbide, metal nitride, and metal silicon nitride, for example. Formation of the gate electrode 110 in embodiments may include atmospheric layer deposition (ALD), chemical vapor deposition (CVD), and plasma vapor deposition (PVD), for example.

Figure 1C:
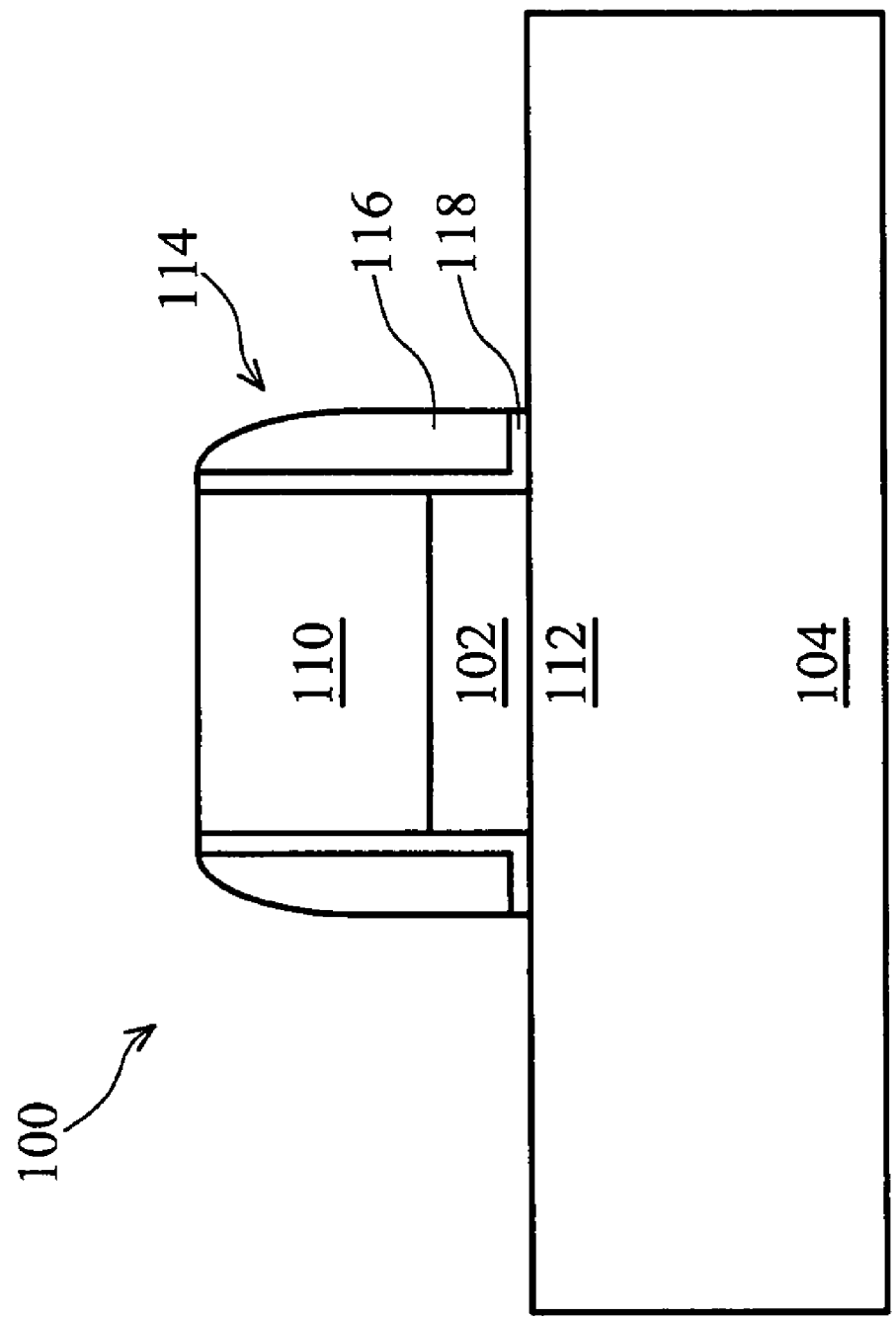

Referring now to FIG. 1C, the method of the first embodiment further includes forming an n-FET spacer structure 114 adjacent to the n-FET gate electrode 110. The n-FET spacer structure 114 includes an oxide structure 116 formed on a silicon nitride structure 118 in this example. However in an embodiment, the spacer structure 114 may be made from any suitable material(s), may be formed using any known or later developed process, and may be a single layer or a composite dielectric structure, for example.

Figure 1D:
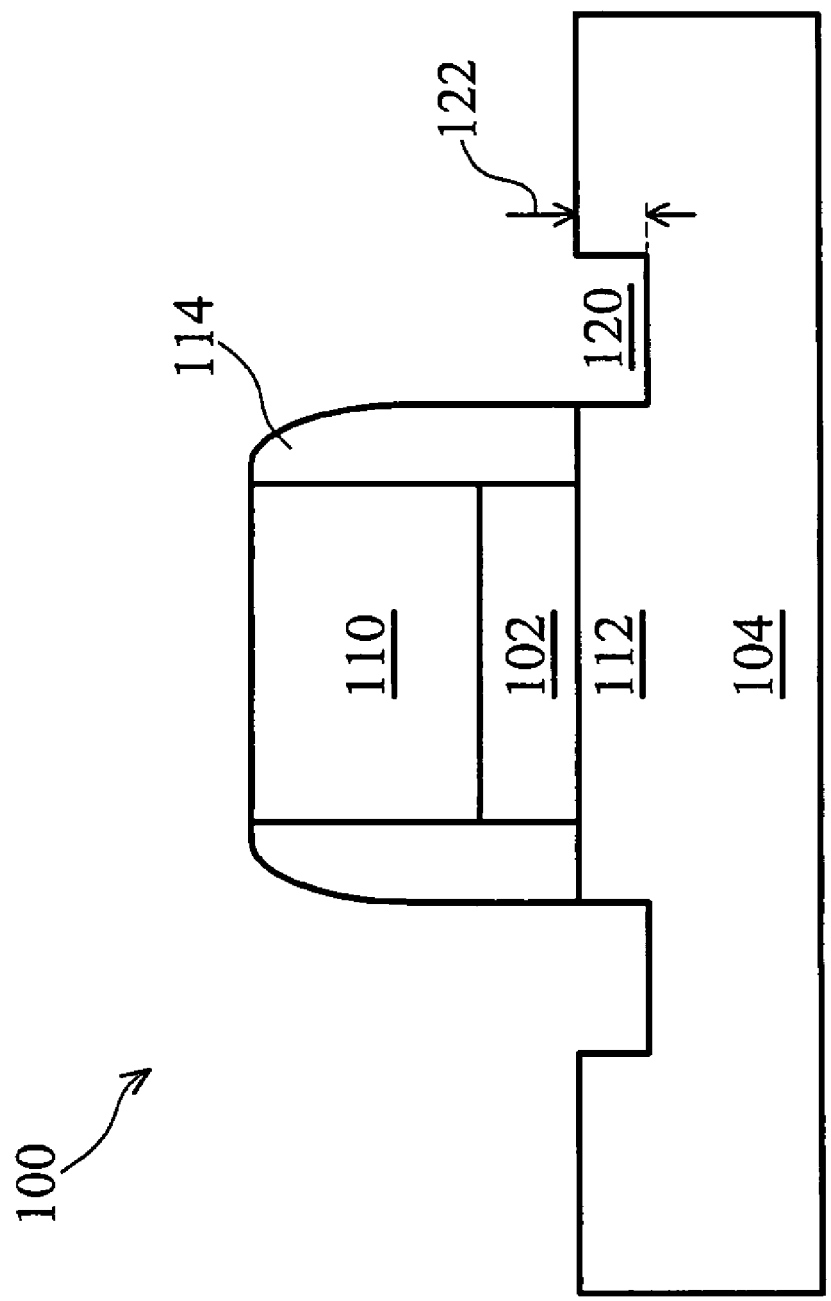

With reference to FIG. 1D, an n-FET recess 120 is formed in the n-FET substrate 104 adjacent to the n-FET spacer structure 114. The n-FET recess 120 in an embodiment may have any suitable depth. In embodiments of the present invention, the formation of an n-FET recess 120 may be omitted, for example.

Figure 1E:
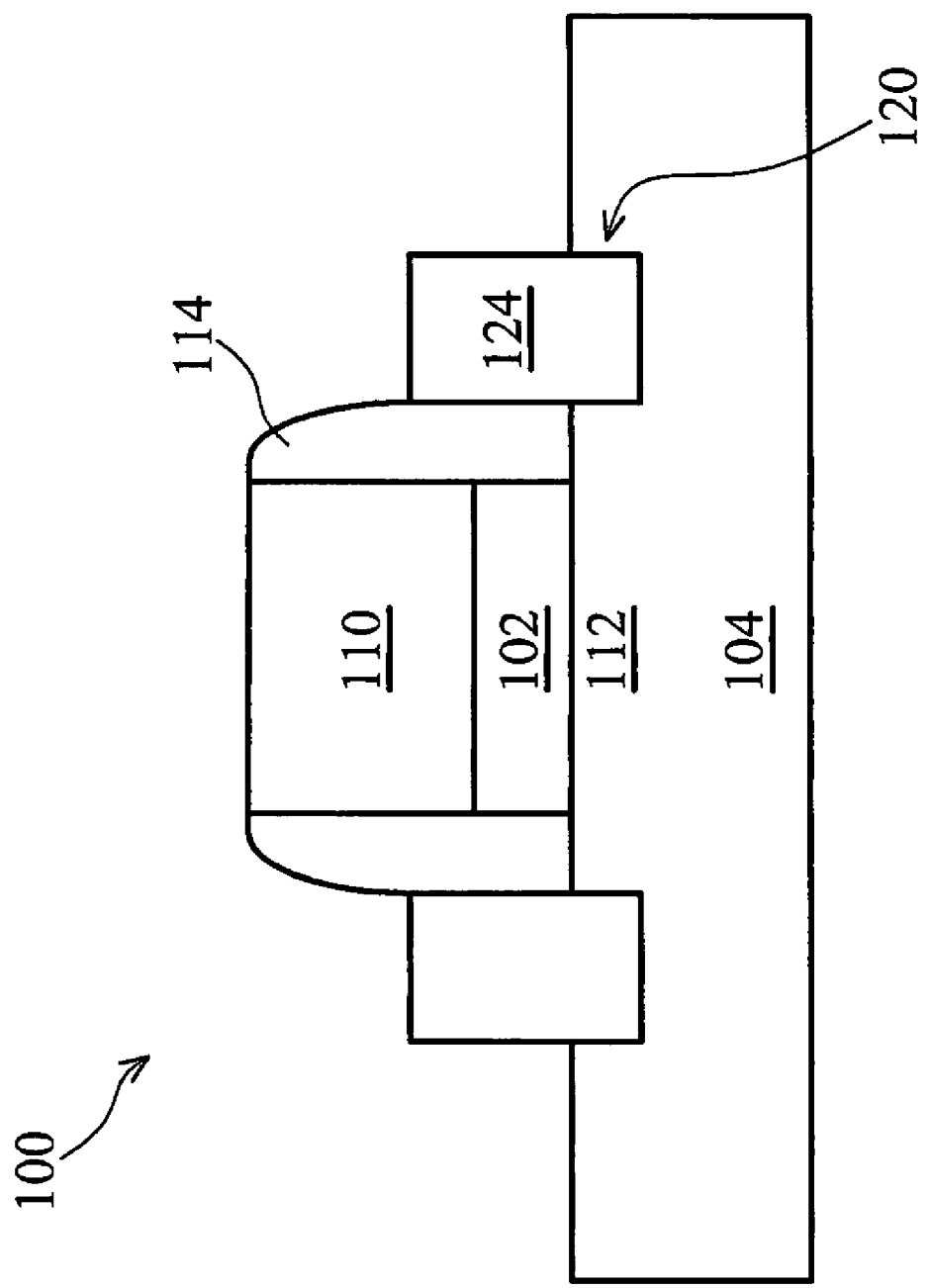

As shown in FIG. 1E, the method of the first embodiment still further includes forming an elevated n-FET source/drain structure 124 adjacent to the n-FET gate electrode 110, such that the n-FET spacer structure 114 is located at least partially between the elevated n-FET source/drain structure 124 and the n-FET gate electrode 110. The elevated n-FET source/drain structure 124 is preferably epitaxially grown from the n-FET substrate 104 in the n-FET recess 120. A silicon carbon (Si:C) material is used during epitaxy to form the elevated n-FET source/drain structure 124 in this example. It is noted that in contrast with the ceramic compound silicon carbide (SiC), silicon carbon (Si:C) is a silicon material that is lightly doped (e.g., doping concentrations of about 1% to 2%) with a carbon material. The formation of the elevated n-FET source/drain structure 124 may include low-pressure chemical vapor deposition (LPCVD), or molecular beam epitaxy (MBE), for example. The epitaxy may be performed using a selective epitaxial growth (SEG) process, for example. The elevated n-FET source/drain structure 124 may include a source/drain structure material such as silicon, germanium, carbon, and combinations thereof, for example. In embodiments of the present invention, the n-FET source/drain structure 124 may include materials such that the n-FET channel region 112 is strained.

Figure 1F:
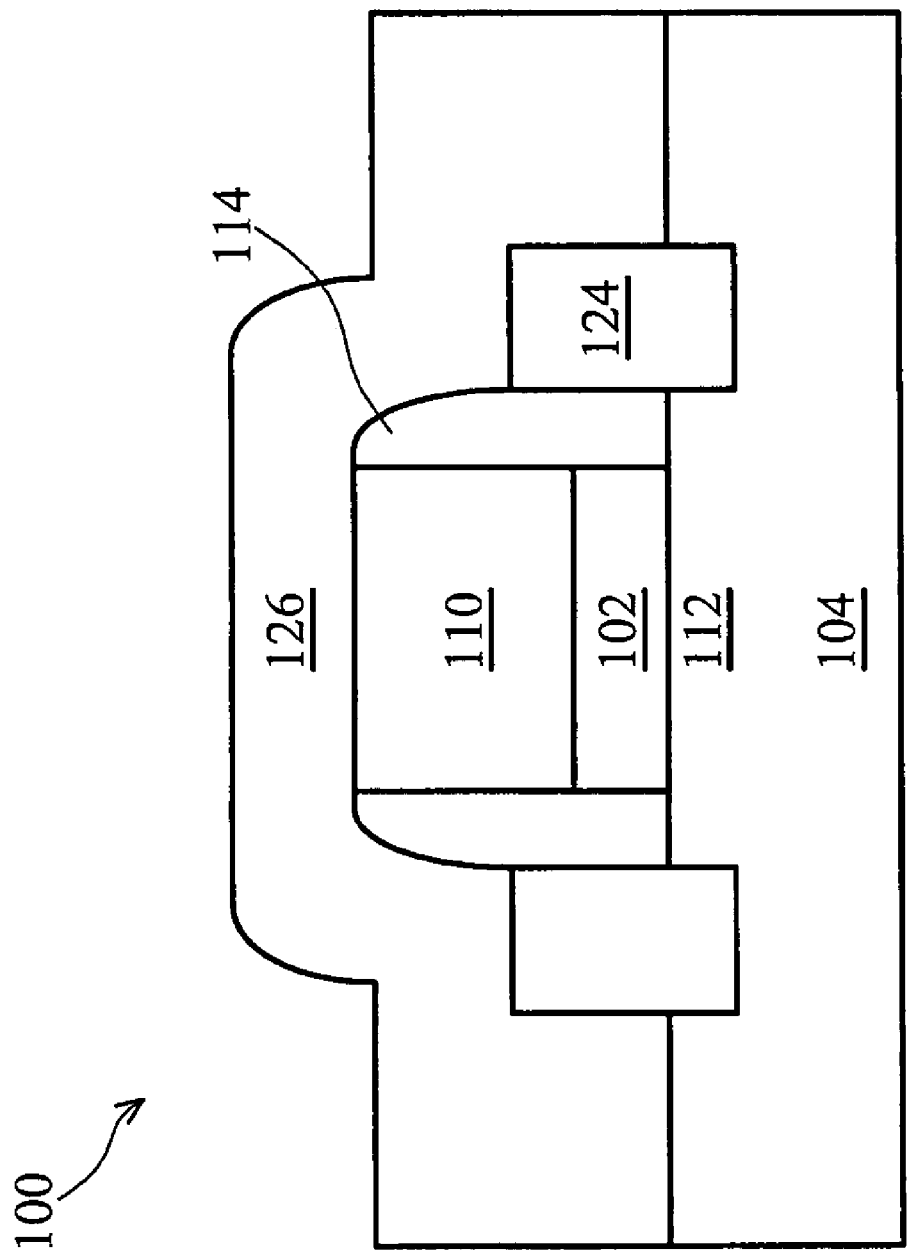
Figure 1G:
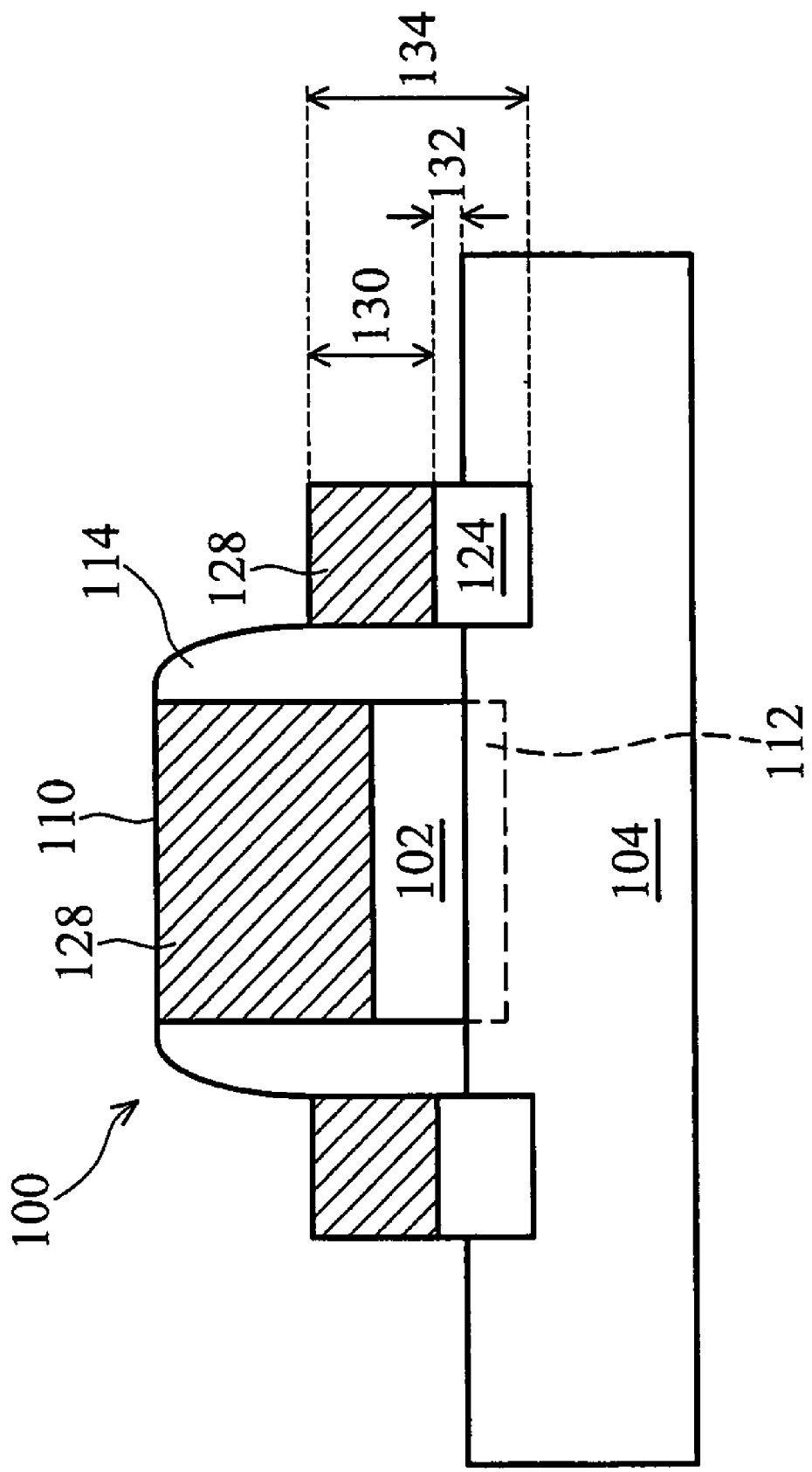

The formation of the integrated circuit device of the first embodiment includes a silicidation step. The silicidation step of the first embodiment includes two steps, however, one skilled in the art will recognize that wafer silicidation may have any number of steps. FIGS. 1F and 1G illustrate the silicidation of the n-FET gate electrode 110 and the n-FET source/drain structure 124.

With reference to FIG. 1F, a first step in the silicidation of the n-FET 100 includes the deposition of a metal layer 126. The deposition of the metal layer 126 may be performed using ALD, CVD, or PVD, for example. The metal layer 126 preferably includes pure metal or alloyed metal. Materials in the metal layer 126 in embodiments may include or contain nickel (Ni), cobalt (Co), NiYb, tantalum (Ta), titanium (Ti), ruthenium (Ru), molybdenum (Mo), cobalt (Co), NiPt, aluminum (Al), alloys thereof, and combinations thereof, for example.

FIG. 1G shows the n-FET 100 after a thermal treatment. Thermal treatment of the n-FET 100 may include rapid thermal processing (RTP), for example. During thermal treatment, the pure metal or metal alloy material in the metal layer 126 (see FIG. 1F) has reacted with the doped polysilicon material in the n-FET gate electrode 110 to form a metal or metal alloy silicide material 128 in the n-FET gate electrode 110. Remaining portions (not shown) of the metal are removed after the silicidation thermal treatment. As shown in FIG. 1G, at least a majority of the n-FET gate electrode 110 is silicided 128 (i.e., includes metal from the silicidation process). Thus, the n-FET gate electrode 110 is preferably a fully silicided (FUSI) gate. In other embodiments the n-FET gate electrode 110 may be formed from metal (e.g., during the metal deposition step in a silicidation step). The source/drain structures may be formed via silicidation while the n-FET gate electrode is formed from a metal (or, alloyed metal) layer (instead of metal silcides), such as TaC, TaN, TaSiN, etc., formed using ALD, PVD, or CVD, for example.

As shown in FIG. 1G, during thermal treatment of the n-FET 100 the pure metal or metal alloy material has also reacted with the Si:C material in the n-FET source/drain structure 124. As shown in FIG. 1G, at least a portion 128 of the elevated n-FET source/drain structure 124 is silicided. In embodiments of the present invention, any portion of the elevated n-FET source/drain structure 124 may be silicided. For example, the elevated n-FET source/drain structure 124 may be fully silicided, or may be 50% silicided. In yet another example, a height 130 of the silicided portion 128 of the elevated n-FET source/drain structure 124 may be about 400 nm, about 100 nm, or about 50 nm. These are just some example heights. The key issue is the final height or depth for silicide/non-silicide boundary (defined by 132), which is preferably not be more than 250 A beneath the substrate in the final device. The higher the silicide/non-silicide boundary, the lesser the current-crowding issues in the n-FET source/drain region 124.

The height 134 of the n-FET source/drain structure 124 may be selected to control the distance 132. The n-FET channel region 112 is shown with dotted lines in FIG. 1G. However, the dotted lines in FIG. 1G are merely illustrative and the n-FET channel region 112 may have any shape and size. Furthermore, the n-FET channel region 112 in a final product may not necessarily be as shown in FIG. 1G.

An advantage achieved by embodiments of the present invention include the elevated n-FET source/drain structure 124. The elevated n-FET source/drain structure 124 may be used to prevent the formation of deep source/drain silicides (not shown) beneath the n-FET substrate 104. The absence of deep source/drain silicides in the n-FET substrate 104 prevents undesirable effects during operation, such as current crowding, and/or junction capacitance, for example.

Figure 2A:
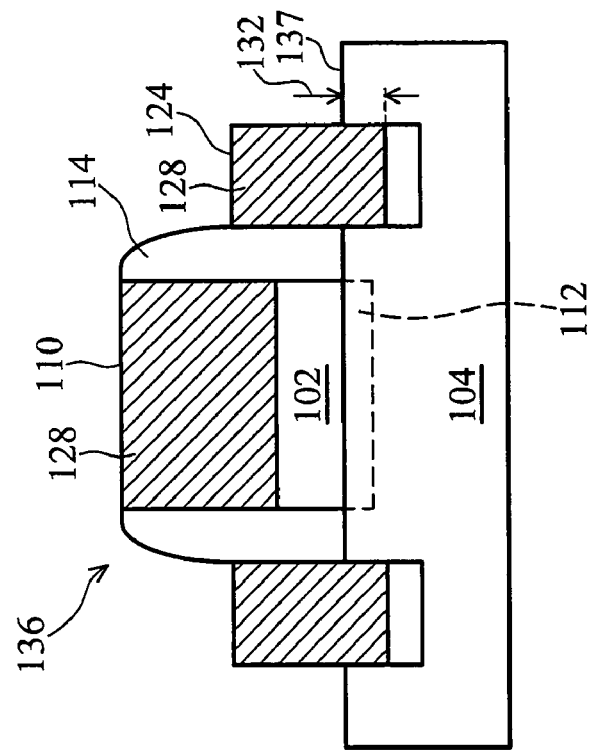
FIGS. 2A and 2B show a cross-sectional view of an integrated circuit device in a second illustrative embodiment of the present invention.
Figure 2B:
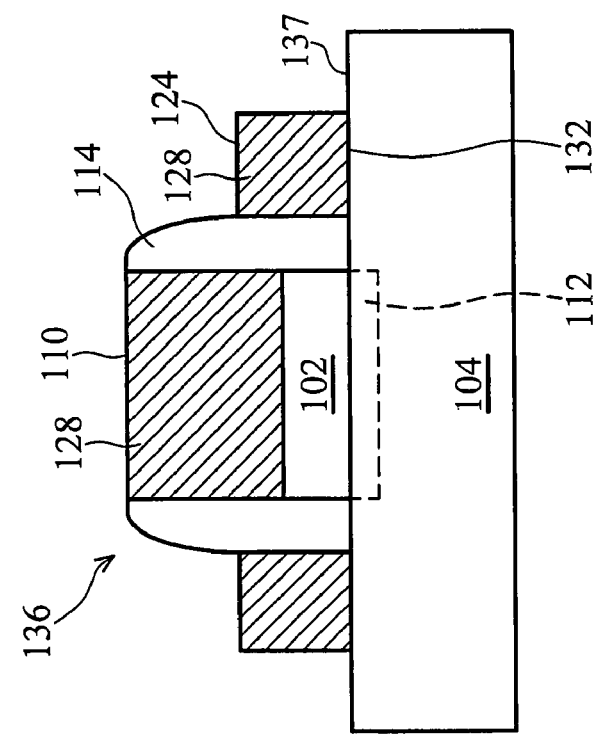

An integrated circuit device of a second illustrative embodiment is shown in FIGS. 2A and 2B. The integrated circuit device of FIG. 2A includes an n-FET 136 formed on an n-FET substrate 104. The n-FET 136 of FIG. 2A does not include a recess in the n-FET substrate 104. Rather, the elevated n-FET source/drain structure 124 of the n-FET 136 of FIG. 2A is epitaxially grown from the surface 137 of the n-FET substrate 104. In FIG. 2A, the elevated n-FET source/drain structure 124 has been fully silicided to the surface of the substrate. In other variations, the silicidation may stop above the surface of the substrate, or may extend into the substrate (preferably not more than about 250 angstroms though).

The integrated circuit device of FIG. 2B includes an n-FET 136 formed in the n-FET substrate 104. The n-FET 136 of FIG. 2B is shown after a thermal treatment in a silicidation step (see e.g., FIG. 1G). In this example, the silicidation extends to a depth 132 below the substrate surface or beneath the substrate, and preferably this depth 132 is not more than about 250 angstroms to avoid or reduce current crowding issues in the channel region.

An advantage achieved by embodiments of the present invention includes the distance between the silicided portion 128 of the n-FET elevated source/drain structure 124. Although, the silicided portion 128 in the n-FET elevated source/drain structure 124 is at least a majority of the n-FET elevated source/drain structure 124, a suitable distance separates the n-FET channel region 112 and the silicided portion 128 of the n-FET elevated source/drain structure 124. By providing a suitable silicidation boundary 132 (preferably not more than 250 angstroms beneath the substrate) for the silicided portion 128 of the n-FET elevated source/drain structure 124, undesired effects during the operation of the n-FET 136 (e.g., current crowding) may be prevented or reduced.

Although the n-FET source/drain structure 124 of FIG. 2A is shown completely silicided, in other embodiments or variations of this embodiment, the n-FET source/drain structure 124 may be silicided by any suitable or desired amount. The height of the n-FET source/drain structure 124 may be controlled to thereby control the amount of silicidation of the n-FET source/drain structure 124 and the distance 132.

Steps in the method of a third illustrative embodiment of the present invention are illustrated in FIGS. 3A-3I. The integrated circuit device includes an n-FET 138 and a P-Type field effect transistor (p-FET) 140 in a wafer 142. FIGS. 3A-3I are cross-sectional views of the n-FET 138 and the p-FET 140.

Figure 3A:
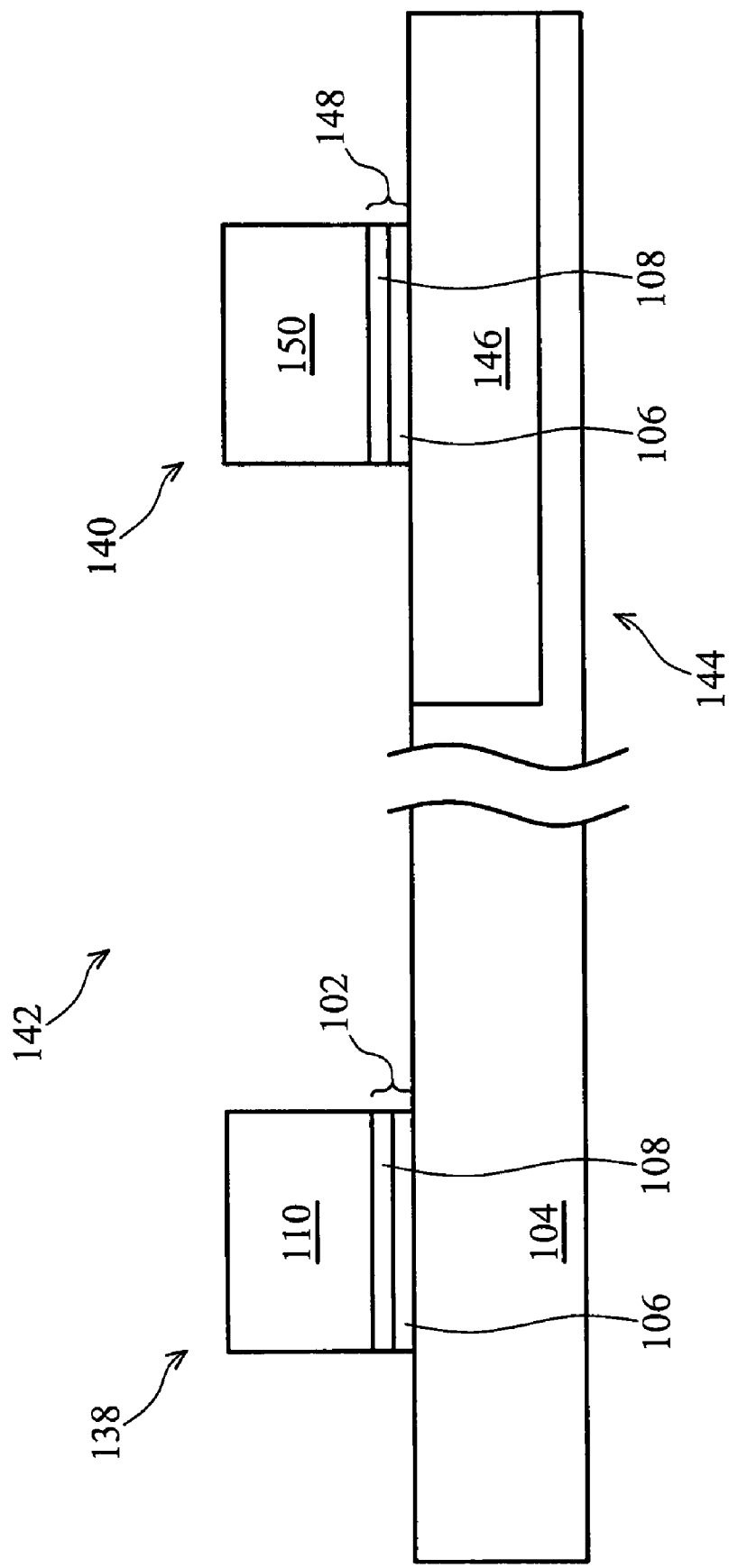
FIGS. 3A-3I show cross-sectional views of an integrated circuit device at various stages in a method of a third illustrative embodiment of the present invention.

With reference to FIG. 3A, the method of the third embodiment includes forming an n-FET gate dielectric 102 and an n-FET gate electrode 110 on an n-FET substrate 104, and a p-FET gate dielectric 148 and a p-FET gate electrode 150 on the p-FET substrate 144. The n-FET 138 is in an n-FET substrate 104 and the p-FET 140 is a in a p-FET substrate 144. The p-FET substrate 144 includes an N-type well (Nwell) region 146. The n-FET gate dielectric 102 and the p-FET gate dielectric 148 each include a high-k dielectric layer 106 formed over a base oxide layer 108 in this example.

In embodiments of the present invention, the p-FET gate dielectric 148 and the n-FET gate dielectric 102 are high-k gate dielectrics. However, in embodiments of the present invention, the gate dielectrics 102, 148 may not be the same. For example, the n-FET gate dielectric 102 in embodiments may have a different shape, composition, number of layers, thickness of layers, equivalent oxide thickness (EOT), and structure than the p-FET gate dielectric 148, for example.

Figure 3B:
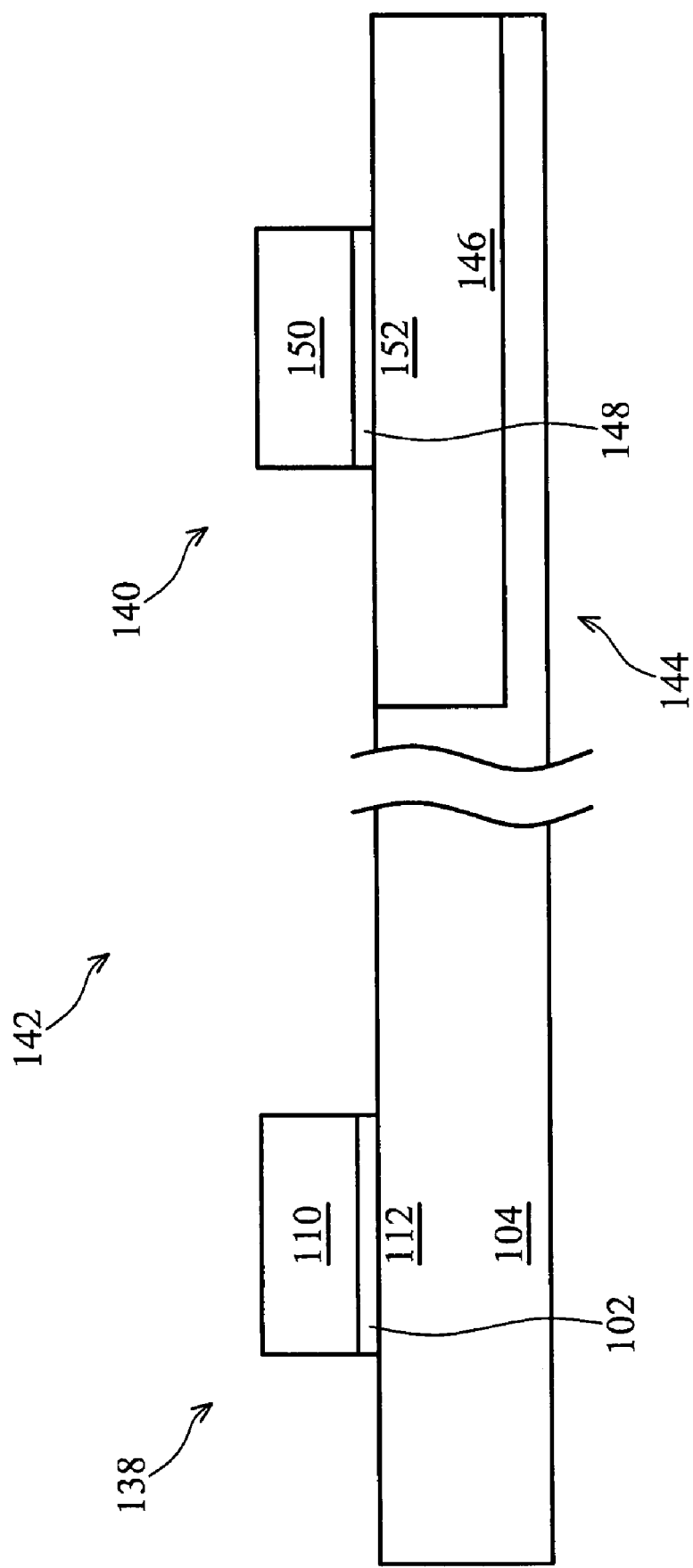

In FIG. 3B, the gate dielectrics 102 and 148 are shown more simplified. As shown in FIG. 3B, the n-FET gate electrode 110 is formed such that the n-FET gate dielectric 102 is located between the n-FET gate electrode 110 and an n-FET channel region 112 in the n-FET substrate 104. The p-FET gate electrode 150 is formed such that the p-FET gate dielectric 148 is located between the p-FET gate electrode 150 and a p-FET channel region 152 in the p-FET substrate 144.

Figure 3C:
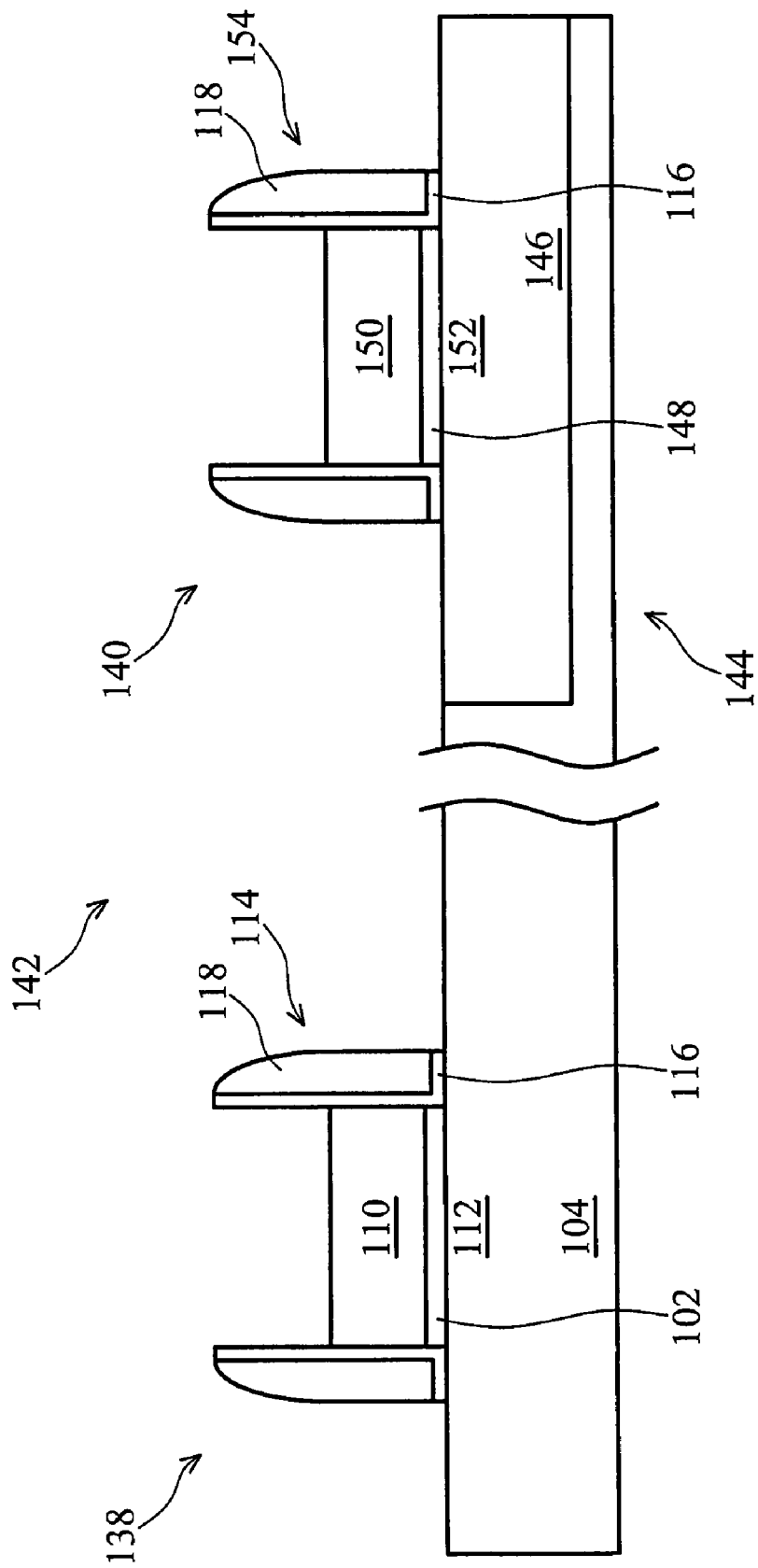

Referring now to FIG. 3C, an n-FET spacer structure 114 and a p-FET spacer structure 154 have been formed. The n-FET spacer structure 114 is formed adjacent to the n-FET gate electrode 114. The p-FET spacer structure 154 is adjacent to the p-FET gate electrode 150. The spacer structures 114, 154 include a silicon nitride structure 118 formed on an oxide structure 116, in this example. In embodiments of the present invention, the spacer structures 114, 154 may not be the same. For example, the n-FET spacer structure 114 in embodiments may have a different shape, composition, and structure than the p-FET spacer structure 154. Materials of the spacer may be any suitable spacer materials. The spacer structures may be formed using any suitable process currently known or later developed.

Figure 3D:
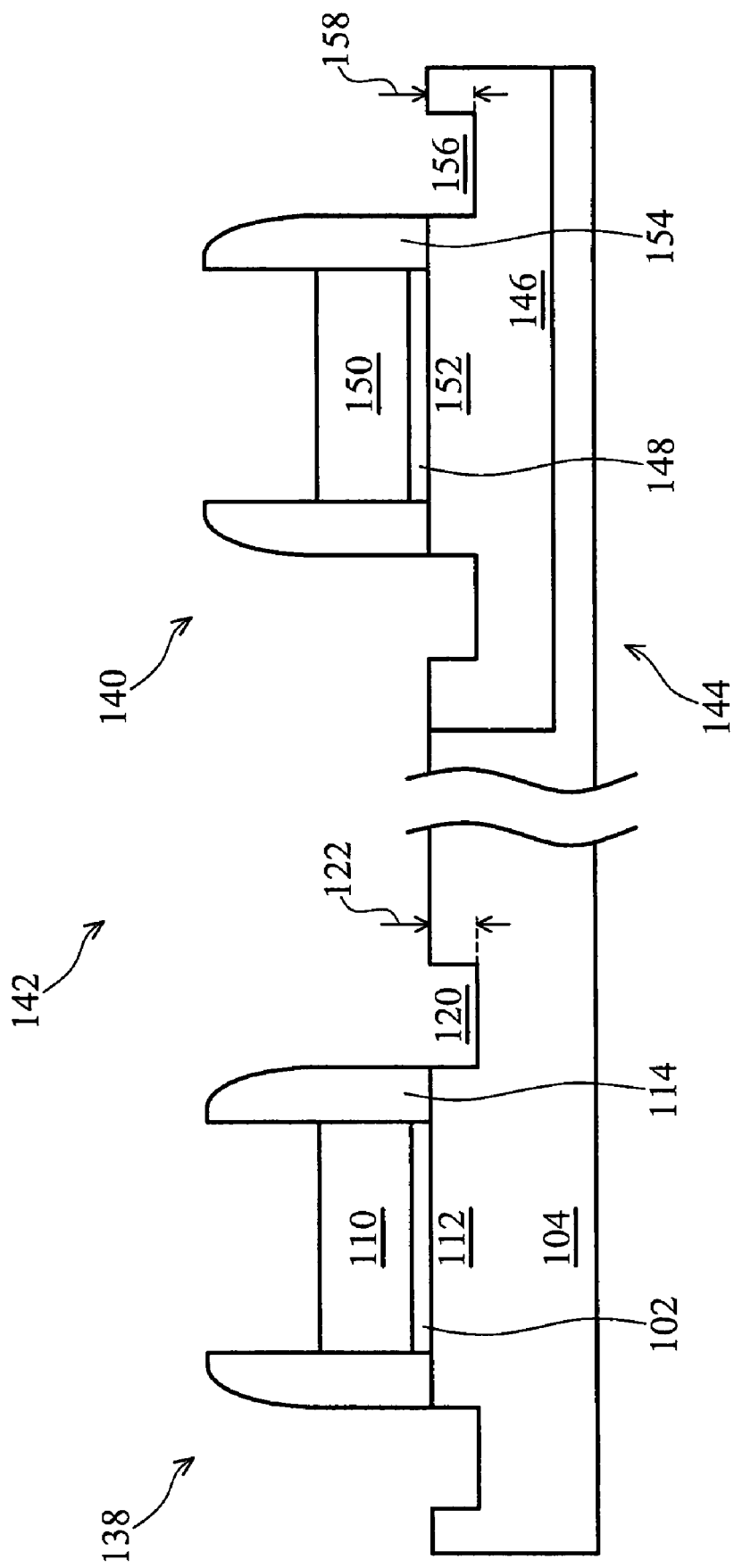

With reference to FIG. 3D, the third embodiment further includes forming an n-FET recess 120 in the n-FET substrate 104 and a p-FET recess 156 in the p-FET substrate 144. The n-FET recess 120 is formed adjacent to the n-FET spacer structure 114. The depth 122 of the n-FET recess 120 and the depth 158 of the p-FET recess 156 are about 400 nm. In other embodiments of the present invention, the depth 122 of the n-FET recess 120 and the depth 158 of the p-FET recess 156 are not the same. For example, in embodiments the n-FET 138 may not have a recess (e.g., the n-FET recess depth is zero) and the p-FET recess depth 158 may be about 300 nm. Preferably, the p-FET recess depth 158 is greater than zero. However, the n-FET recess depth 122 may be any suitable depth, for example.

Figure 3E:
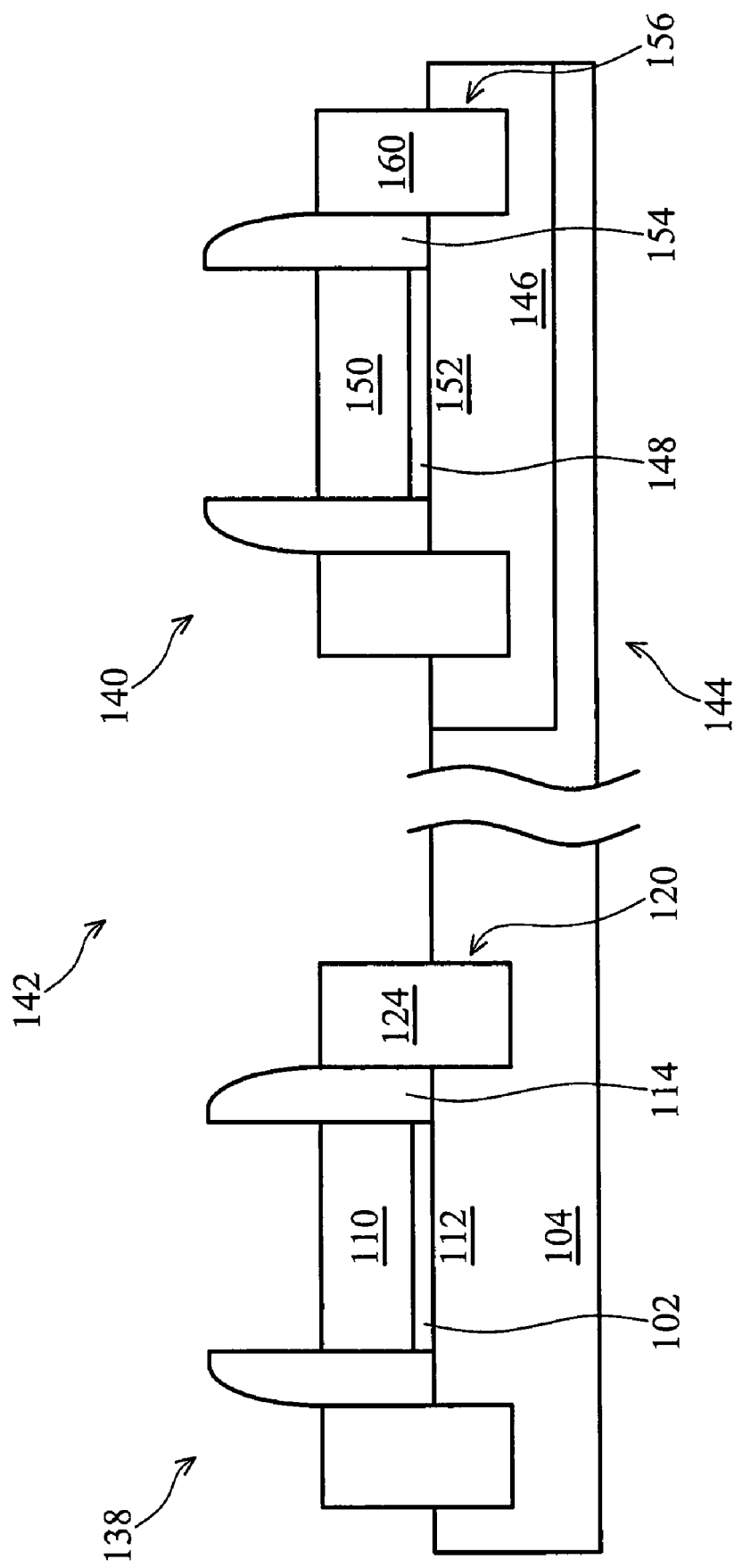

As shown in FIG. 3E, an elevated n-FET source/drain structure 124 is formed adjacent to the n-FET gate electrode 110, such that the n-FET spacer structure 114 is located at least partially between the elevated n-FET source/drain structure 124 and the n-FET gate electrode 110. Selective epitaxial growth (SEG) is preferably used to form the n-FET source/drain structure 124 from the n-FET substrate 104 in the n-FET recess 116. The n-FET source/drain structure 124 includes a silicon carbon (Si:C) material. The Si:C material in the n-FET elevated source/drain structure 124 forms a strain on the n-FET channel region 112. A selective epitaxial growth process is also used to form a p-FET elevated source/drain structure 160 from the p-FET substrate 144 in the p-FET recess 156. The p-FET elevated source/drain structure 160 preferably includes a silicon germanium (SiGe) material. The SiGe material in the p-FET elevated source/drain structure 160 forms a strain on the p-FET channel region 152.

Figure 3F:
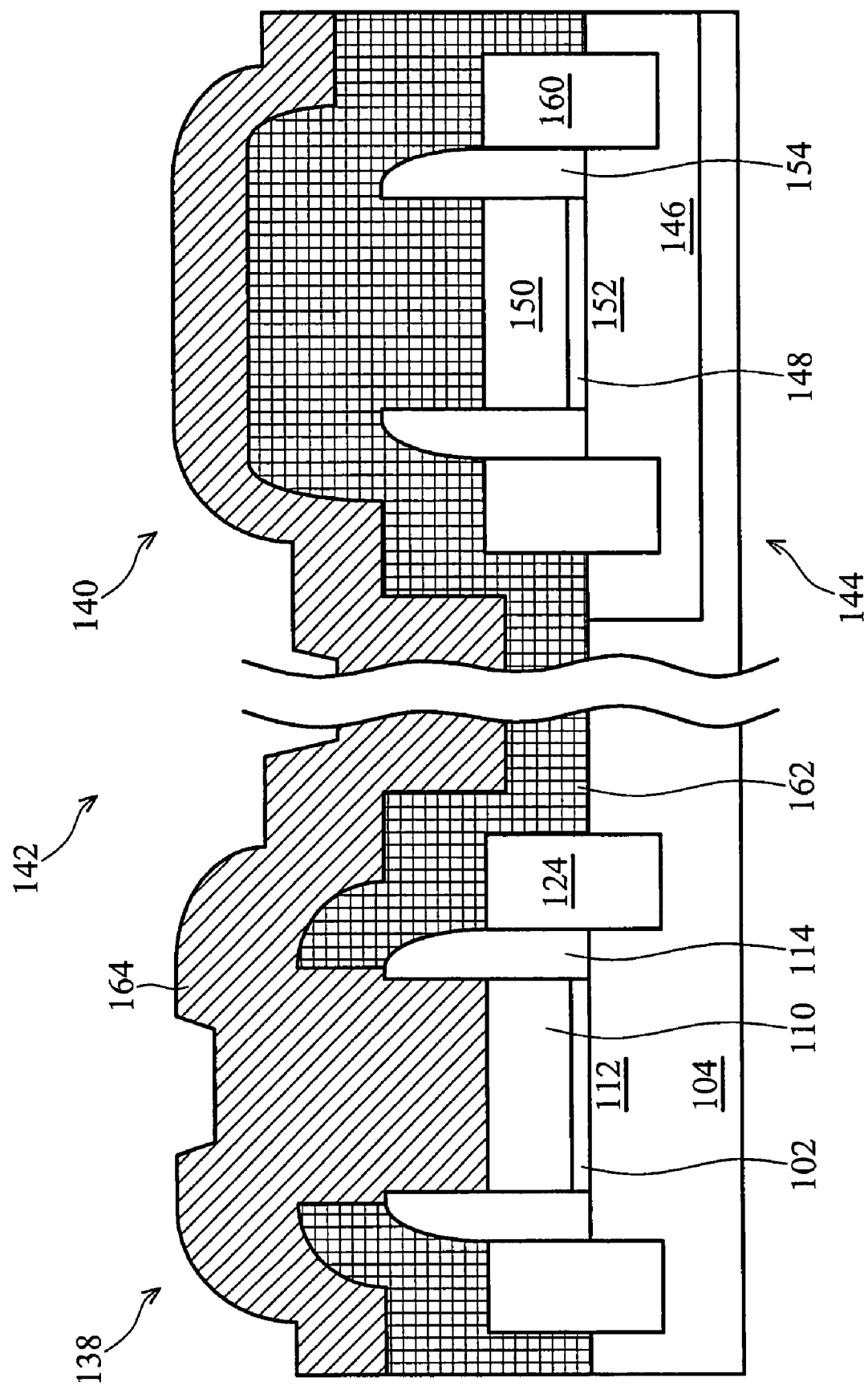
Figure 3G:
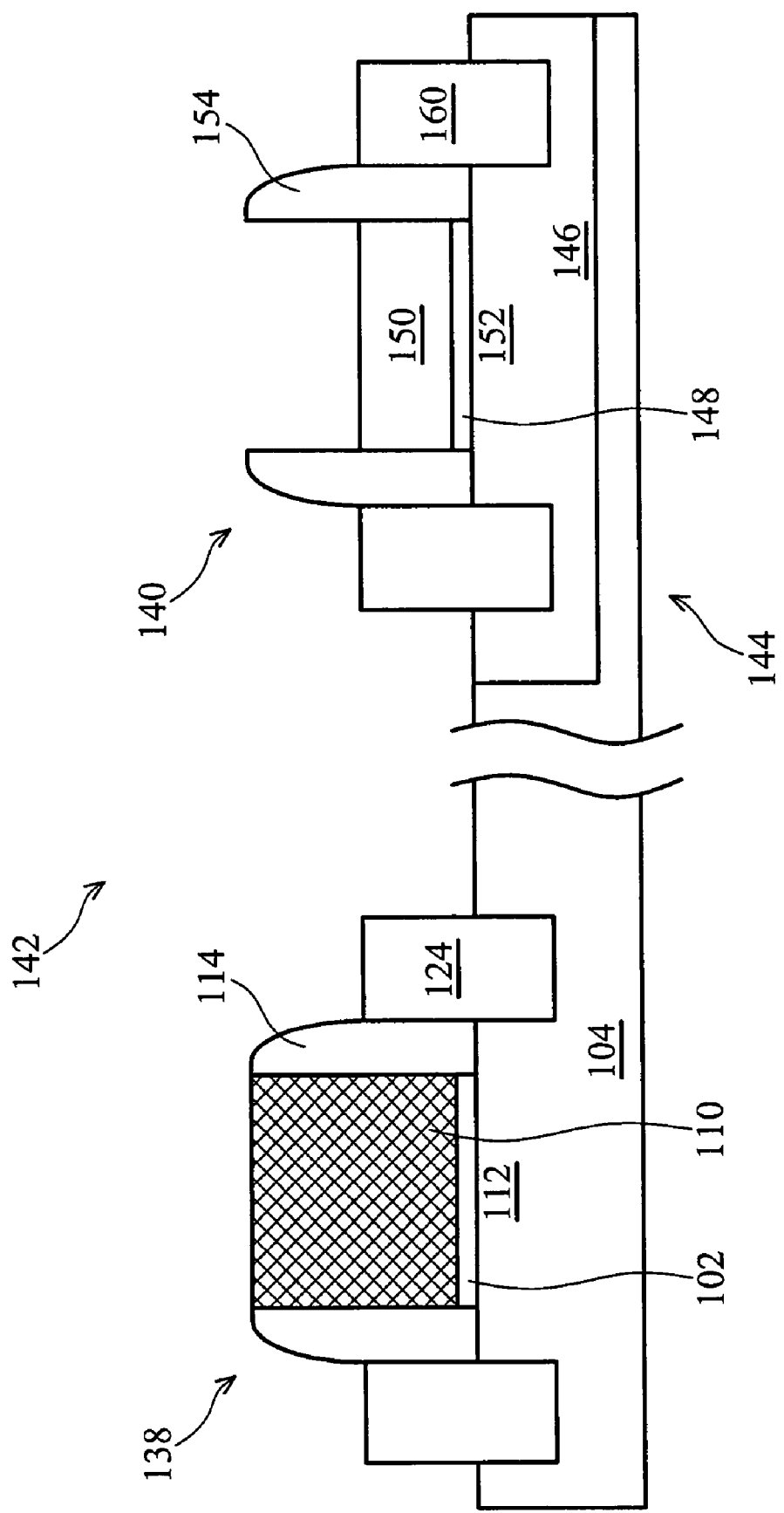
Figure 3H:
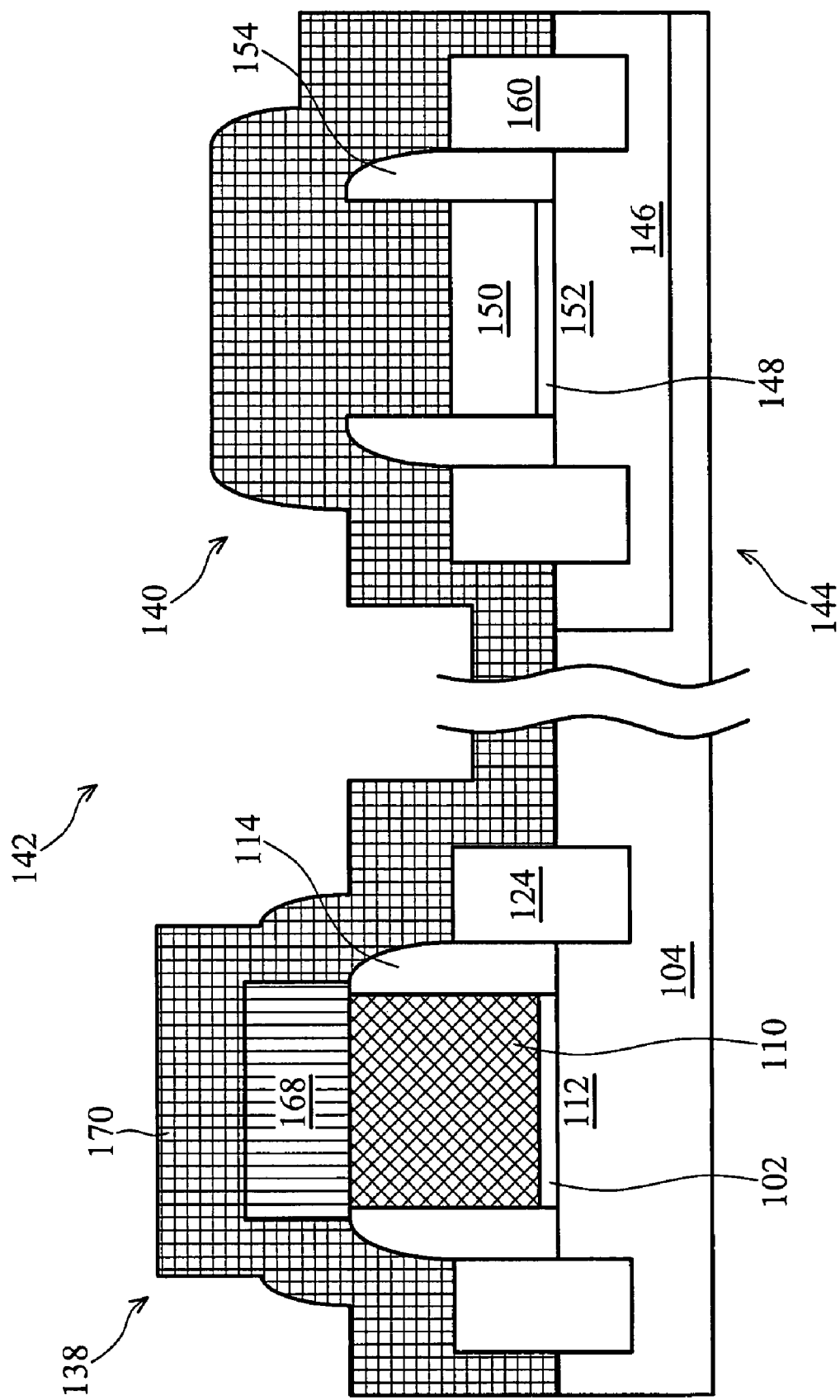
Figure 3I:
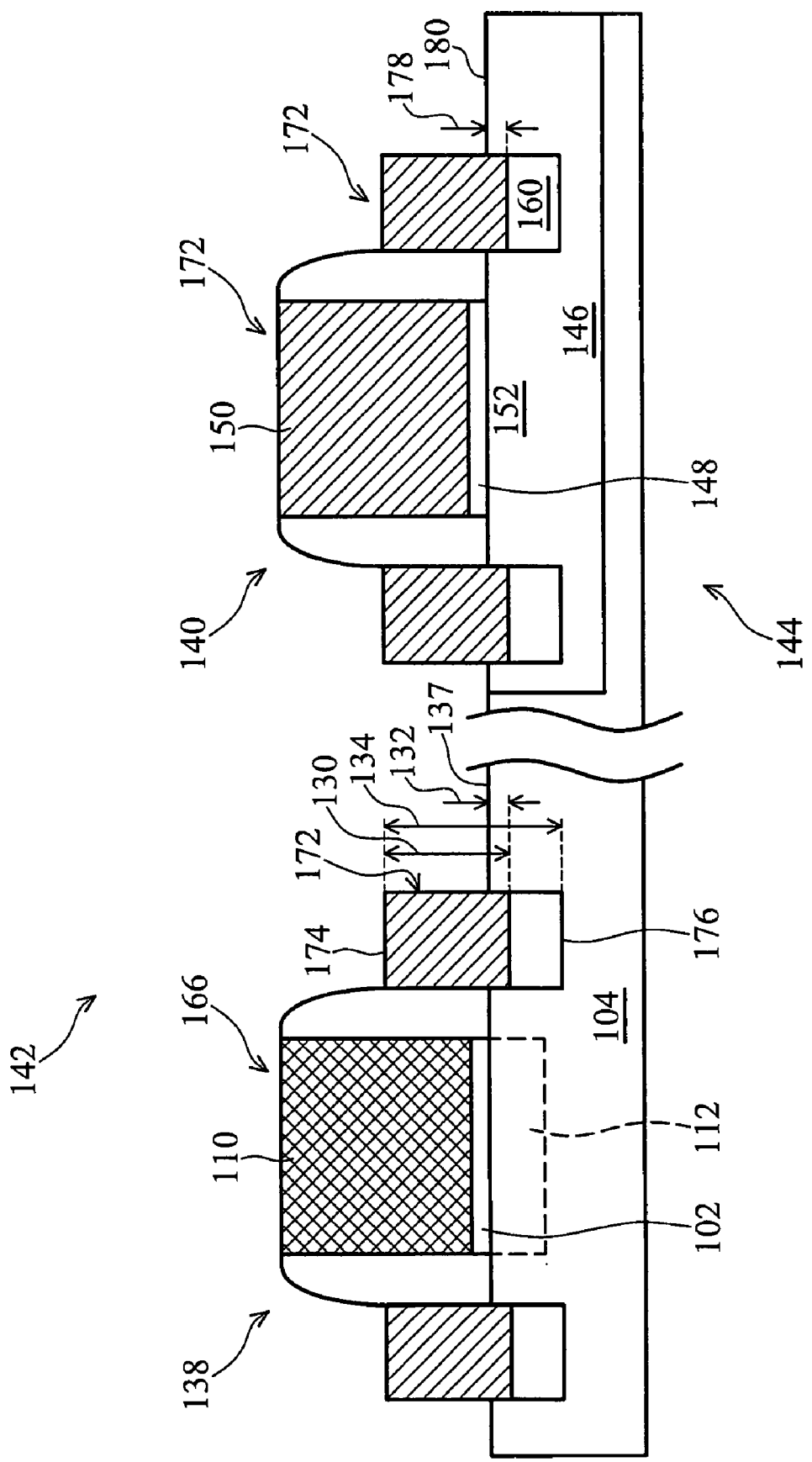

In FIGS. 3F-3I, the n-FET 138 and the p-FET 140 of the third embodiment are silicided in two silicidation steps. The first silicidation step shown in FIGS. 3F-3G shows the silicidation of the n-FET gate electrode 110. The second silicidation step shown in FIGS. 3H-3I shows the silicidation of the p-FET gate electrode 150, the n-FET source/drain structure 124, and the p-FET source/drain structure 160. Although not shown in FIGS. 3A-3I, there will typically be isolation regions (e.g., STI, FOX) will extend on each side of the n-FET and the p-FET to separate and isolate them from each other and/or other adjacent devices.

With reference to FIG. 3F, a protective mask 162 has been formed over the p-FET 140 and over the n-FET elevated source/drain structure 124. A metal layer 164 of a nickel (Ni) material has been deposited over the mask 162 and formed on the n-FET gate electrode 110.

FIG. 3G shows the wafer 142 after a thermal treatment step in the first silicidation step. The nickel material in the metal layer 164 has combined with the polysilicon material in the n-FET gate electrode 110 to form a nickel silicide material 166 in at least a majority of the silicided n-FET gate electrode 110. Thus, the silicided 166 n-FET gate electrode 110 shown in FIG. 3F is preferably a fully silicided (FUSI) gate, or a metal gate, for example. In other embodiments the n-FET gate electrode 110 may be formed from metal (e.g., during the metal deposition step in a silicidation step). Also shown in FIG. 3G, unused portions of the metal layer 164 (see FIG. 3F) have been removed, and the protective mask 162 (see FIG. 3F) has also been removed.

FIGS. 3H-3I show the wafer 142 of the third embodiment at various stages of a second silicidation step. In FIG. 3H, a protective cap 168 has been formed over the silicided n-FET gate electrode 110. Following the formation of the protective cap 168, a metal layer 170 that includes a nickel platinum (NiPt) material has been formed over the n-FET 138 and over the p-FET 140. The NiPt metal layer 170 is formed on the elevated n-FET source/drain structure 124, formed on the p-FET source/drain structure 160, and formed on the p-FET gate electrode 150.

FIG. 3I shows the n-FET 138 and the p-FET 140 after a thermal treatment in the second silicidation step of the third embodiment. The wafer 142 has been thermally treated and unused portions of the NiPt material in the metal layer 170 (see FIG. 3H) have been removed. The protective cap 168 (see FIG. 3H) has also been removed. FIG. 3I shows the silicided portions 172 of the n-FET source/drain structure 124, the p-FET source/drain structure 160, and the p-FET gate electrode 150. At least a majority of the p-FET gate electrode 150 includes a metal silicide of silicon, nickel, and platinum (SiNiPt) at the p-FET channel region 152. Thus, the p-FET gate electrode 150 is preferably a fully silicided (FUSI) gate.

In FIG. 3I, the silicided portion 172 of the n-FET source/drain structure 124 extends to an n-FET silicided depth 132 below the surface 137 of the n-FET substrate 104. Preferably, the n-FET silicided depth in embodiments of the present invention is not more than about 250 angstroms below a top surface of the substrate. The silicided portion 172 of the p-FET source/drain structure 154 extends to a p-FET silicided depth 178 below the surface 180 of the p-FET substrate 144. Preferably, the p-FET silicided depth in embodiments of the present invention is also not more than about 250 angstroms below a top surface of the substrate. This prevents or reduces current crowding.

In FIG. 3I, an advantage is achieved by embodiments of the present invention in which the n-FET source/drain structure 124 and the p-FET source/drain structure 160 are silicided in a single silicidation step. The simultaneous silicidation of the n-FET source/drain structure 124 and the p-FET source/drain structure 160 in embodiments reduces the number of manufacturing steps, thus reducing complexity and saving time. The reduced complexity and time savings may result in cost savings and a higher yield, for example.

Also shown in FIG. 3I, another advantage achieved by embodiments of the present invention includes the elevated n-FET source/drain structure 124. The elevated n-FET source/drain structure 124 prevents the formation of deep source/drain silicides (not shown) in the n-FET substrate 104. The absence of deep source/drain silicides in the n-FET substrate 104 prevents undesirable effects during operation, such as current crowding and junction capacitance, for example.

With reference still to FIG. 3I, yet another advantage achieved by embodiments of the present invention is control of the distance 132 for the silicide boundary of the n-FET source/drain structure 124 and the n-FET channel region 112. In embodiments of the present invention, the amount of silicidation may be pre-determined. For example, the amount of silicidation may correspond to the amount of silicidation needed to fully silicide a the n-FET gate electrode 110. Because the amount of silicidation is known, the depth 130 to which the elevated n-FET source/drain structure 124 may be silicided may also be known. In embodiments, the height 173 of the n-FET source/drain structure 124 may be controlled. The height 134 is the distance between a top surface 174 of the n-FET source/drain structure 124 and the surface 176 of the n-FET recess 120. By controlling the height 173 of the elevate n-FET source/drain structure it, the distance 132 may also be controlled. The control of the distance 132 may provide beneficial control of behavioral characteristics of the n-FET 138 during operation. In addition, control of the distance 132 may prevent undesirable effects such as current crowding, for example.

FIG. 3I illustrates still yet another advantage achieved by embodiments of the present invention, in which the occurrence of the poly-depletion effect in the n-FET gate electrode 110 and in the p-FET gate electrode 150 is prevented. It is known to one skilled in the art that during operation, poly-silicon gate electrodes may be susceptible to the poly-depletion effect due to a lack of charge carriers. In contrast, embodiments of the present invention may include a fully silicided gate electrode or a metal gate electrode, which have an abundance of charge carriers. An abundance of charge carriers prevents charge depletion near the channel region during transistor operation. Preventing charge depletion near the channel region of the gate electrode enhances the performance and reliability of the n-FET 138 and the p-FET 140 during operation.

Although a same metal layer 170 is shown in the figures for the silicidation (for simplification), there may be variations in other embodiments. The metal used to silicide the elevated n-FET source/drain structure will typically differ from the metal used to silicide the elevated p-FET source/drain structure, but they may still share the same thermal treatment step (for still having simultaneous silicidation), for example. Similarly, if one of the gate electrodes is silicided simultaneously with the silicidation of the source/drain structures, the metal used to silicide the gate electrode will typically differ (even though they may still share the same thermal treatment step of the silicidation to still have a simultaneous silicidation). Often, it may be desirable to use a different metal to silicide each portion, even though different portions may share a thermal treatment step. This is advantageous for limiting or reducing the number of thermal treatment steps experienced by the device, which causes thermal stresses on the device and may cause unwanted diffusions in other areas of the device, for example. In most all uses, n-FET FUSI material is very likely to be different from p-FET FUSI material to achieve different work-functions. So, they will most likely to be separated processes. A key advantage of raised source/drain in both n-FET and p-FET is that silicidation of elevated source/drain structures (be it n-FET source/drain alone, p-FET source/drain alone, or both source/drains together) is that they may be performed simultaneously during silicidation of any one of the gate electrodes.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit device, comprising:

forming an n-FET gate dielectric on a substrate and a p-FET gate dielectric on the substrate;

forming an n-FET gate electrode on the n-FET gate dielectric and a p-FET gate electrode on the p-FET gate dielectric, wherein the n-FET gate electrode and the p-FET gate electrode each comprise metal, wherein the n-FET gate dielectric is located between the n-FET gate electrode and the substrate at an n-FET channel region, and the p-FET gate dielectric is located between the p-FET gate electrode and the substrate at a p-FET channel region;

forming an n-FET spacer structure adjacent to the n-FET gate electrode;

forming a p-FET spacer structure adjacent to the p-FET gate electrode;

forming an elevated n-FET source/drain structure adjacent to the n-FET gate electrode, such that the n-FET spacer structure is located at least partially between the elevated n-FET source/drain structure and the n-FET gate;

forming an elevated p-FET source/drain structure adjacent to the p-FET gate electrode, such that the p-FET spacer structure is located at least partially between the elevated p-FET source/drain structure and the p-FET gate electrode; and siliciding at least a first portion of the elevated n-FET source/drain structure and at least a first portion of the elevated p-FET source/drain structure in a source/drain-structure silicidation step, wherein at least a thermal treatment portion of the source/drain structure siliciding is performed simultaneously for the elevated n-FET source/drain structure and for the elevated p-FET source/drain structure, wherein the at least a first portion of the elevated n-FET source/drain structure extends to at least the surface of the substrate.

2. The method of claim 1, wherein the source/drain-structure silicidation step further comprises:

forming a protective mask;

depositing a metal layer over the n-FET and p-FET source/drain structures; and applying a thermal treatment.

3. The method of claim 1, wherein the n-FET gate electrode is also silicided during the source/drain-structure silicidation step.

4. The method of claim 1, wherein the n-FET gate electrode is silicided in a gate-electrode silicidation step, wherein the source/drain-structure silicidation step is different from the gate-electrode silicidation step.

5. The method of claim 1, wherein the p-FET gate electrode is also silicided during the source/drain-structure silicidation step.

6. The method of claim 1, wherein the p-FET gate electrode is silicided in a gate-electrode silicidation step, wherein the source/drain-structure silicidation step is different from the gate-electrode silicidation step.

7. A method of forming an integrated circuit device, comprising:

forming an n-FET gate dielectric on a substrate and a p-FET gate dielectric on the substrate;

forming an n-FET gate electrode on the n-FET gate dielectric and a p-FET gate electrode on the p-FET gate dielectric, wherein the n-FET gate electrode and the p-FET gate electrode each comprise metal, wherein the n-FET gate dielectric is located between the n-FET gate electrode and the substrate at an n-FET channel region, and the p-FET gate dielectric is located between the p-FET gate electrode and the substrate at a p-FET channel region;

forming an n-FET spacer structure adjacent to the n-FET gate electrode;

forming a p-FET spacer structure adjacent to the p-FET gate electrode;

forming an elevated n-FET source/drain structure adjacent to the n-FET gate electrode, such that the n-FET spacer structure is located at least partially between the elevated n-FET source/drain structure and the n-FET gate electrode;

forming an elevated p-FET source/drain structure adjacent to the p-FET gate electrode, such that the p-FET spacer structure is located at least partially between the elevated p-FET source/drain structure and the p-FET gate electrode; and siliciding at least a first portion of the elevated n-FET source/drain structure and at least a first portion of the elevated p-FET source/drain structure in a source/drain-structure silicidation step, wherein at least a thermal treatment portion of the source/drain structure siliciding is performed simultaneously for the elevated n-FET source/drain structure and for the elevated p-FET source/drain structure;

wherein the p-FET metal gate electrode is silicided in a p-FET gate-electrode silicidation step and the n-FET gate electrode is silicided in an n-FET gate-electrode silicidation step, wherein the source/drain-structure silicidation step is different from the p-FET gate-electrode silicidation step, the source/drain-structure silicidation step is different from the n-FET gate-electrode silicidation step, and the p-FET gate-electrode silicidation step is different from the n-FET gate-electrode silicidation step.

8. The method of claim 1, wherein the p-FET gate electrode and the n-FET gate electrode are simultaneously silicided in a gate-electrode silicidation step, wherein the source/drain-structure silicidation step is different from the gate-electrode silicidation step.

9. The method of claim 1, further comprising:

forming an n-FET recess in the substrate adjacent to the n-FET spacer structure; and wherein the elevated n-FET source/drain structure extends from the substrate in the n-FET recess.

10. The method of claim 1, further comprising:

selecting an n-FET source/drain structure height to control a depth of the silicidation of the n-FET source/drain structure so that the silicidation depth is not more than about 250 angstroms below a top surface of the substrate.

11. The method of claim 1, further comprising:

forming an n-FET recess in the substrate adjacent to the n-FET spacer structure; and epitaxially growing the elevated n-FET source/drain structure from the substrate in the n-FET recess, wherein the epitaxial growing is performed using a selective epitaxial growth process.

12. The method of claim 11, wherein the elevated n-FET source/drain structure comprises Si:C, having about 1-2% carbon.

13. The method of claim 1, wherein the forming of the elevated p-FET source/drain structure comprises epitaxially growing the elevated p-FET source/drain structure from a p-FET recess in the substrate, wherein the epitaxial growing is performed using a selective epitaxial growth process.

14. The method of claim 13, wherein the elevated p-FET source/drain structure comprises SiGe.

15. The method of claim 1, wherein the n-FET gate dielectric and the p-FET gate dielectric each comprise a same high-k dielectric material layer.

16. A method of forming an integrated circuit device, comprising:

forming an n-FET gate dielectric on a substrate and a p-FET gate dielectric on the substrate, wherein the n-FET gate dielectric and the p-FET gate dielectric each comprise high-k dielectric material;

forming an n-FET gate electrode structure on the n-FET gate dielectric and a p-FET gate electrode structure on the p-FET gate dielectric, wherein the n-FET gate dielectric is located between the n-FET gate electrode structure and the substrate at an n-FET channel region, and the p-FET gate dielectric is located between the p-FET gate electrode structure and the substrate at a p-FET channel region;

forming an n-FET spacer structure adjacent to the n-FET gate electrode;

forming an n-FET recess in the substrate adjacent to the n-FET spacer structure after forming the n-FET spacer structure;

epitaxially growing an elevated n-FET source/drain structure from the substrate in the n-FET recess, wherein the epitaxial growing is performed using a first selective epitaxial growth process, such that the n-FET spacer structure is located at least partially between the elevated n-FET source/drain structure and the n-FET gate electrode;

forming a p-FET spacer structure adjacent to the p-FET gate electrode;

forming a p-FET recess in the substrate adjacent to the p-FET spacer structure;

epitaxially growing an elevated p-FET source/drain structure from the substrate in the p-FET recess, wherein the epitaxial growing is performed using a first selective epitaxial growth process, such that the p-FET spacer structure is located at least partially between the elevated p-FET source/drain structure and the p-FET gate electrode; and simultaneously siliciding the elevated n-FET source/drain structure and the elevated p-FET source/drain structure.

17. The method of claim 16, further comprising:
simultaneously siliciding the p-FET gate electrode structure, n-FET gate electrode structure, or both, while siliciding the elevated n-FET source/drain structure and the elevated p-FET source/drain structure.

18. The method of claim 17, further comprising:
selecting an n-FET source/drain structure height to control a silicidation depth of the n-FET source/drain structure so that the silicidation depth of the n-FET source/drain structure is not more than about 250 angstroms below a top surface of the substrate; and selecting an p-FET source/drain structure height to control a silicidation depth of the p-FET source/drain structure so that the silicidation depth of the p-FET source/drain structure is not more than about 250 angstroms below the top surface of the substrate.

19. A method of forming an integrated circuit device, comprising:
forming an n-FET gate dielectric on a substrate and a p-FET gate dielectric on the substrate, wherein the n-FET gate dielectric and the p-FET gate dielectric each comprise high-k dielectric material;

forming an n-FET gate electrode structure on the n-FET gate dielectric and a p-FET gate electrode structure on the p-FET gate dielectric, wherein the n-FET gate dielectric is located between the n-FET gate electrode structure and the substrate at an n-FET channel region, and the p-FET gate dielectric is located between the p-FET gate electrode structure and the substrate at a p-FET channel region;

forming an n-FET spacer structure adjacent to the n-FET gate electrode;

forming a p-FET spacer structure adjacent to the p-FET gate electrode;

forming an elevated n-FET source/drain structure adjacent to the n-FET gate electrode, such that the n-FET spacer structure is located at least partially between the elevated n-FET source/drain structure and the n-FET gate electrode;

forming a p-FET recess in the substrate adjacent to the p-FET spacer structure;

forming an elevated p-FET source/drain structure extending from the substrate in the p-FET recess, such that the p-FET spacer structure is located at least partially between the elevated p-FET source/drain structure and the p-FET gate electrode; and simultaneously siliciding the elevated n-FET source/drain structure and the elevated p-FET source/drain structure;

also simultaneously siliciding the p-FET gate electrode structure, n-FET gate electrode structure, or both, while siliciding the elevated n-FET source/drain structure and the elevated p-FET source/drain structure;

selecting an n-FET source/drain structure height to control a silicidation depth of the n-FET source/drain structure so that the silicidation depth of the n-FET source/drain structure is not more than about 250 angstroms below a top surface of the substrate; and selecting a p-FET source/drain structure height to control a silicidation depth of the p-FET source/drain structure so that the silicidation depth of the p-FET source/drain structure is not more than about 250 angstroms below the top surface of the substrate.

20. The method of claim 19, further comprises forming an n-FET recess in the substrate adjacent to the n-FET spacer structure; and wherein the forming of the elevated n-FET source/drain structure comprises epitaxially growing an elevated n-FET source/drain structure from the substrate in the n-FET recess, wherein the epitaxial growing is performed using a first selective epitaxial growth process.

* * * * *